United States Patent
Zhou et al.

(10) Patent No.: US 6,917,102 B2
(45) Date of Patent: Jul. 12, 2005

(54) CONTACT STRUCTURE AND PRODUCTION METHOD THEREOF AND PROBE CONTACT ASSEMBLY USING SAME

(75) Inventors: Yu Zhou, Vernon Hills, IL (US); David Yu, Bloomingdale, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/683,832

(22) Filed: Oct. 10, 2003

(65) Prior Publication Data

US 2004/0124519 A1 Jul. 1, 2004

Related U.S. Application Data

(60) Provisional application No. 60/417,716, filed on Oct. 10, 2002.

(51) Int. Cl.[7] .............................................. H01L 23/04
(52) U.S. Cl. ........................ 257/698; 257/690; 438/125
(58) Field of Search ................................ 257/698, 697, 257/690, 700; 439/482, 66; 438/125; 324/758

(56) References Cited

U.S. PATENT DOCUMENTS

| 5,199,889 | A | | 4/1993 | McDevitt, Jr. | |
|---|---|---|---|---|---|
| 5,772,451 | A | * | 6/1998 | Dozier et al. | 439/70 |
| 5,800,184 | A | | 9/1998 | Lopergolo et al. | |
| 5,919,050 | A | | 7/1999 | Kehley et al. | |
| 5,926,951 | A | | 7/1999 | Khandros et al. | |
| 6,561,819 | B1 | * | 5/2003 | Huang et al. | 439/66 |
| 6,653,724 | B1 | * | 11/2003 | Kim et al. | 257/684 |
| 6,676,438 | B2 | * | 1/2004 | Zhou et al. | 439/482 |
| 6,690,185 | B1 | * | 2/2004 | Khandros et al. | 324/758 |
| 6,690,186 | B2 | * | 2/2004 | Fjelstad | 324/762 |
| 6,736,665 | B2 | * | 5/2004 | Zhou et al. | 439/482 |
| 6,750,136 | B2 | * | 6/2004 | Zhou et al. | 438/617 |

* cited by examiner

Primary Examiner—S. V. Clark
(74) Attorney, Agent, or Firm—Muramatsu & Associates

(57) ABSTRACT

A contact structure for establishing electrical connection with contact targets. The contact structure is formed of a contactor carrier and a plurality of contactors attached to a contactor carrier. The contactors are inserted in diagonal through holes on the contactor carrier and attached to the contactor carrier through adhesives. The contactor has a top end having a flat top surface, a straight diagonal beam integral with the top end and configured by an upper beam portion and a lower beam portion, and a lower end at an end of the lower beam portion to contact with a contact target. A length of the upper beam portion and a length of the lower beam portion are about the same. A probe contact assembly using the contact structure is also disclosed which incorporates a flip chip bonding technology to interconnect the components therein.

20 Claims, 32 Drawing Sheets

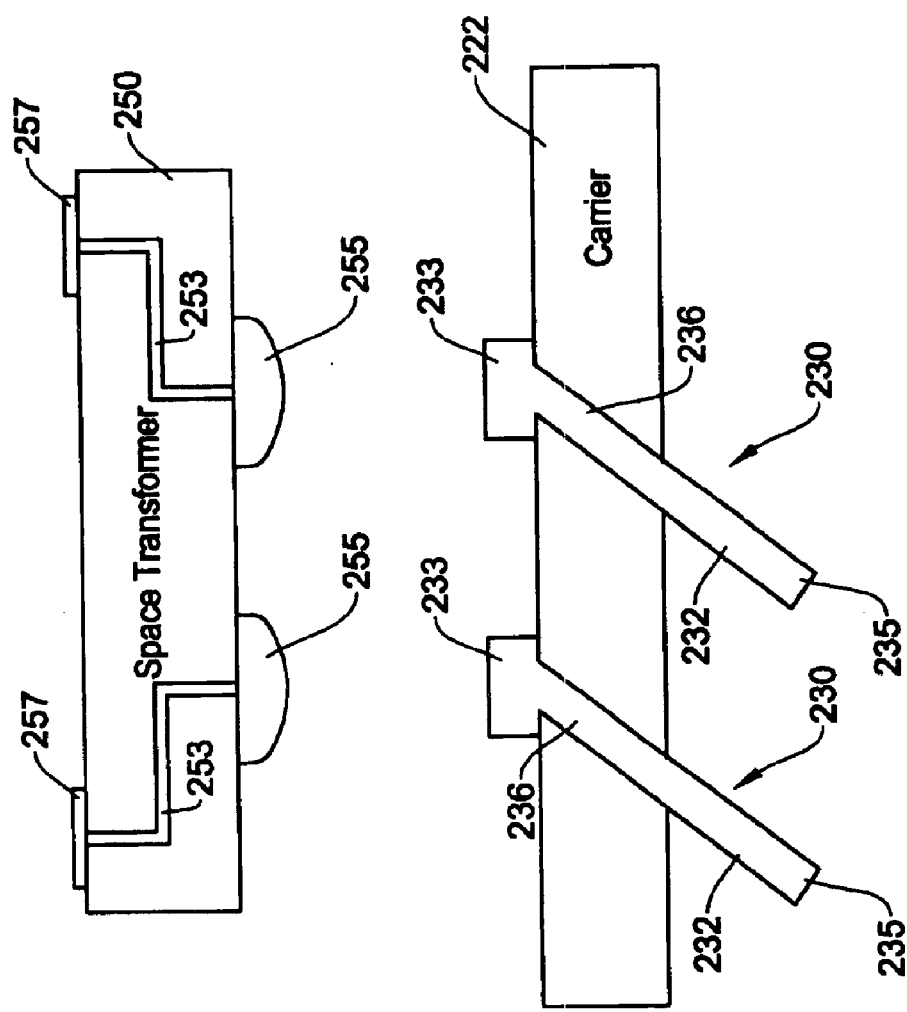

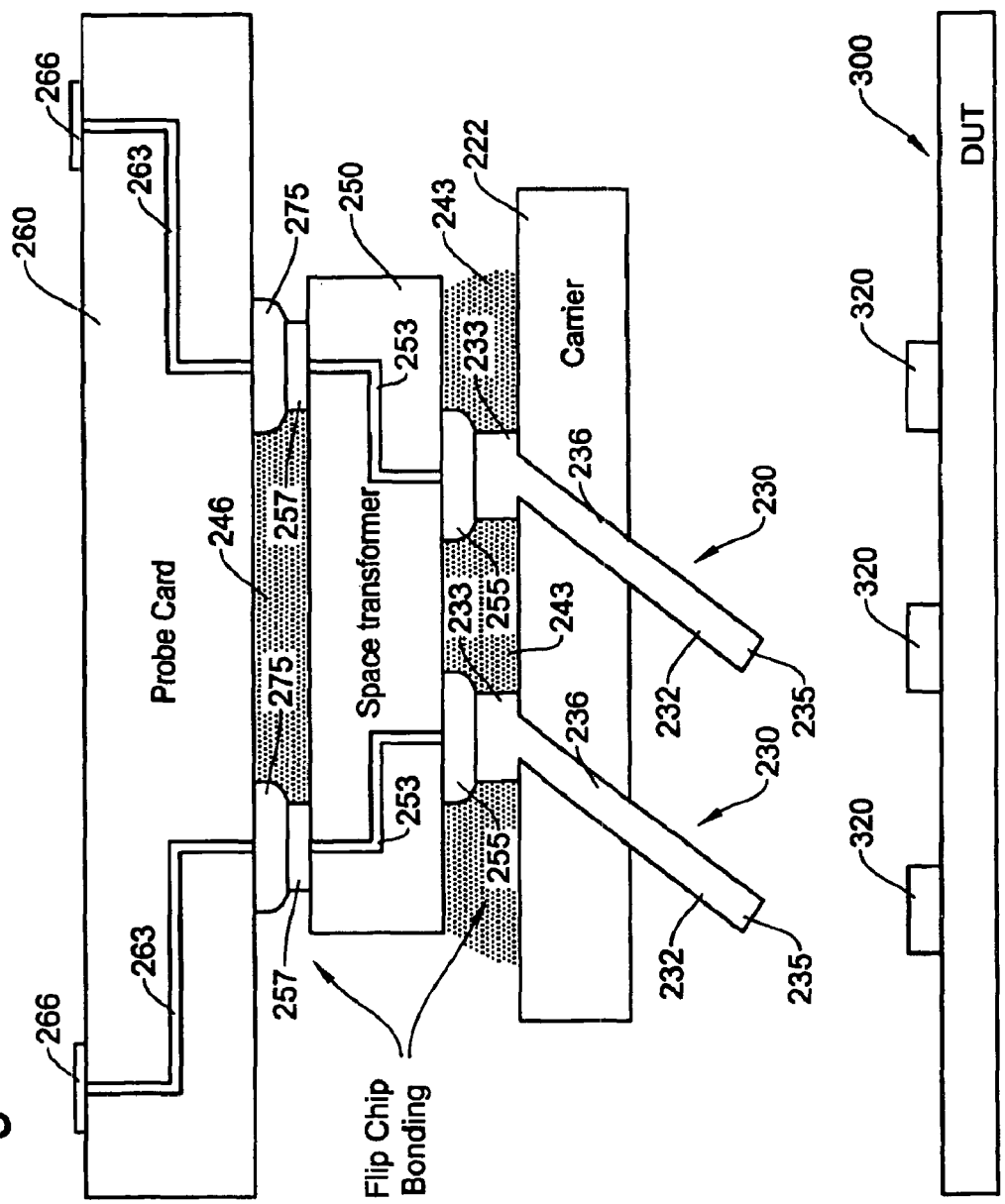

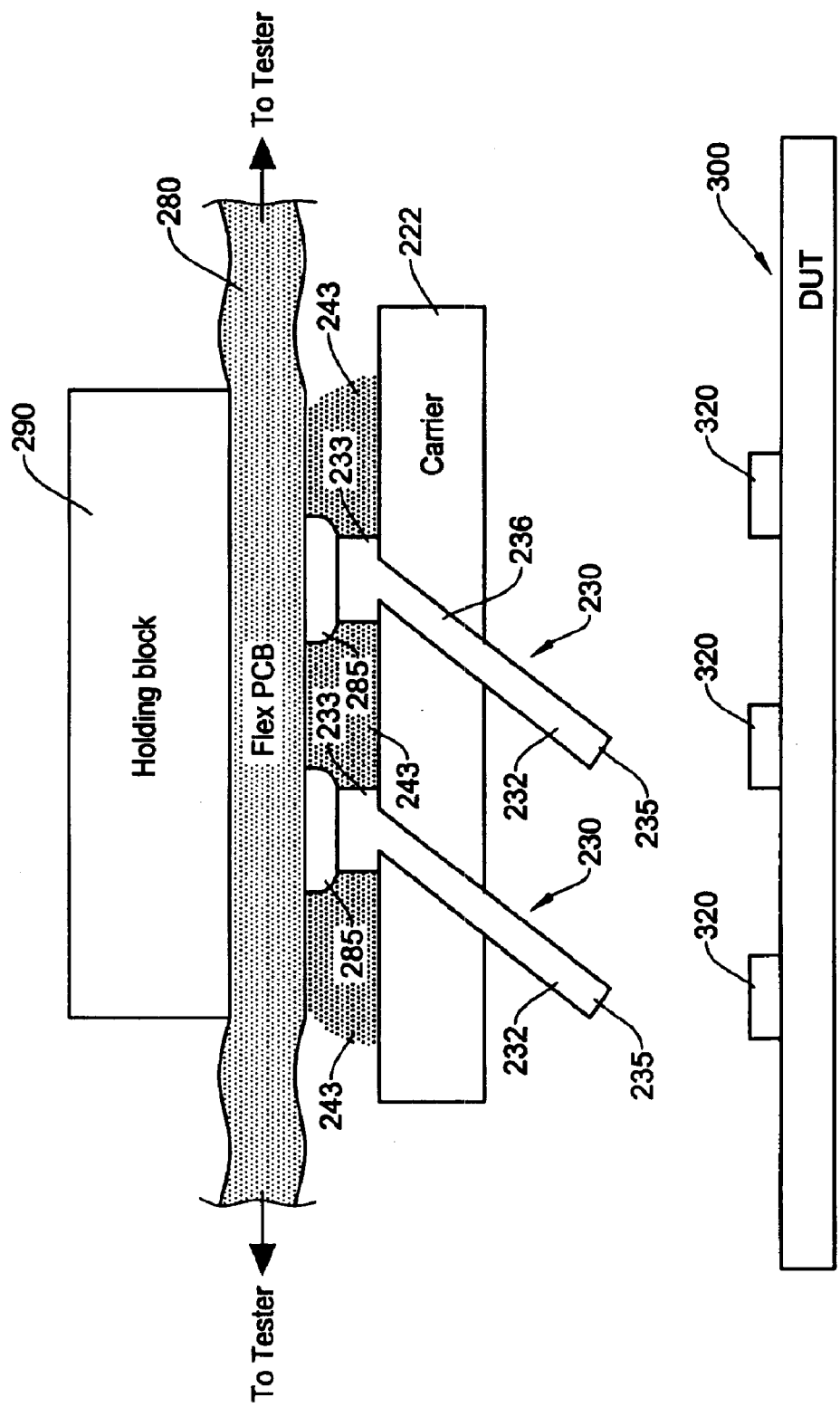

Cantilever contactors $d = L * \cos\theta$

If array pitch is 100µm, then L = 141µm;

Then $d = 141 * \cos\theta$;

If $\theta = 30°$, d = 122µm;

If $\theta = 45°$, d = 99.7µm;

If $\theta = 60°$, d = 70.6µm;

▲ Array pitch P if P = 100µm then L = P / cos45° = 141µm

Fig. 15A
Fig. 15B
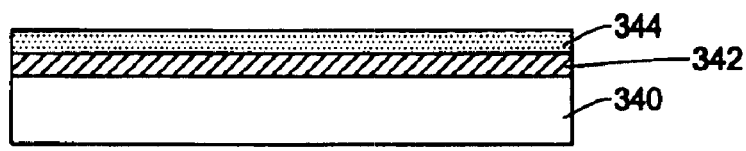
Fig. 15C
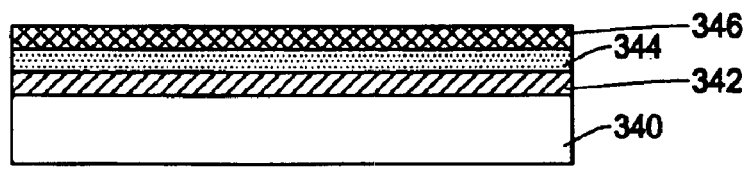
Fig. 15D
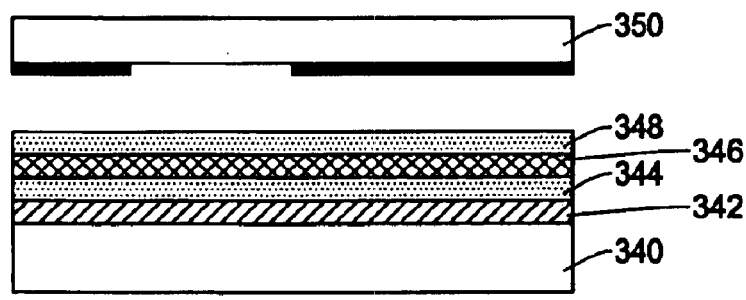

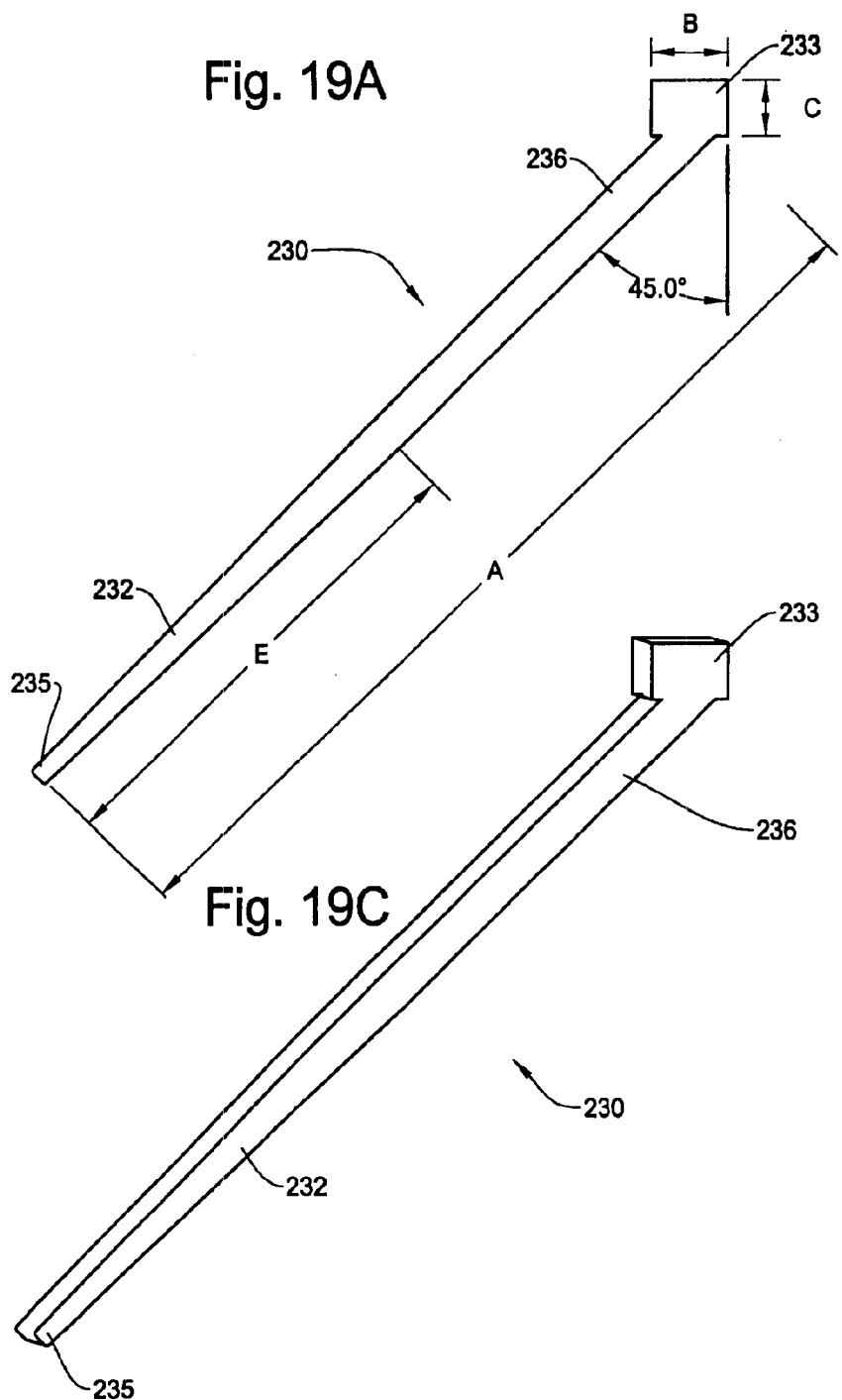

Fig. 20A
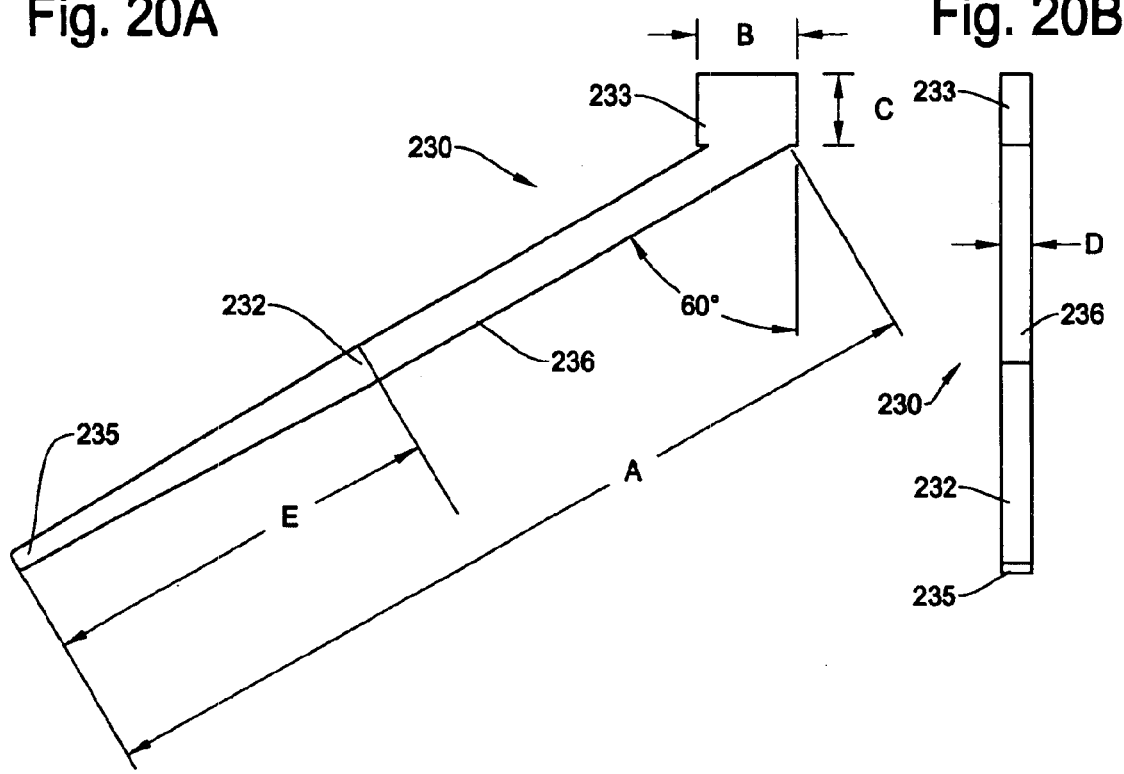
Fig. 20B
Fig. 20C
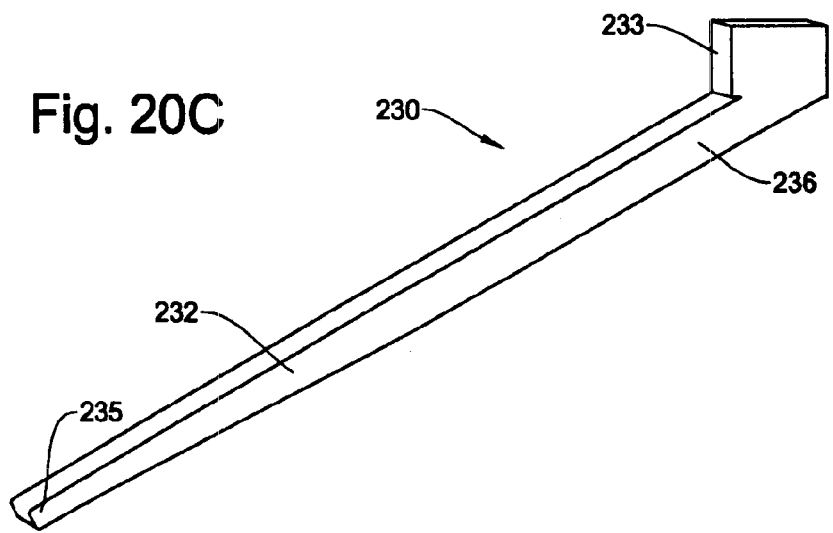

Fig. 23

| | θ = 30° | θ = 45° | θ = 60° |
|---|---|---|---|
| Dimension (μm) | 40 x 50 x 900 | 40 x 50 x 900 | 30 x 40 x 600 |
| Spring Rate | 2.84g / mil | 1.85g / mil | 1.1g / mil |
| Max. Overdrive | 62.3μm | 97.3μm | 65μm |
| Pitch Capability | ≥80μm | ≥100μm | ≥100μm |

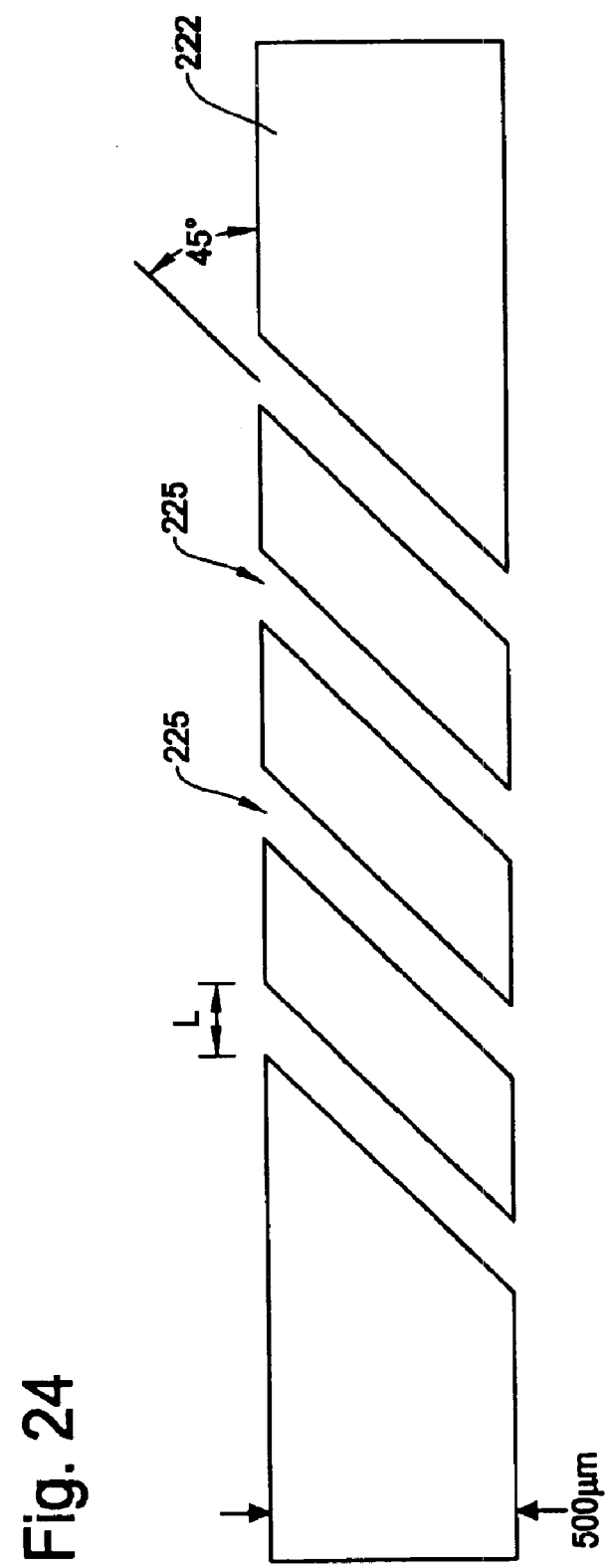

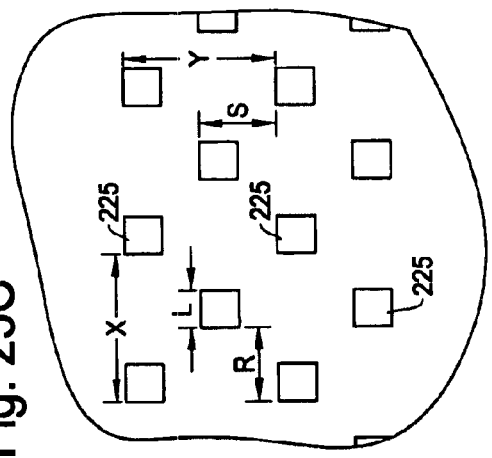
Fig. 25A
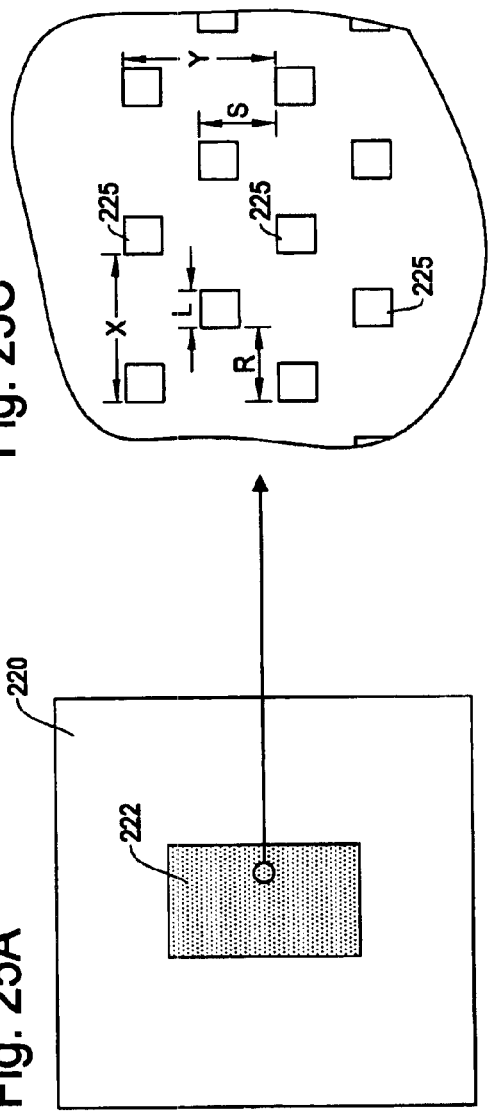
Fig. 25C
Fig. 25B
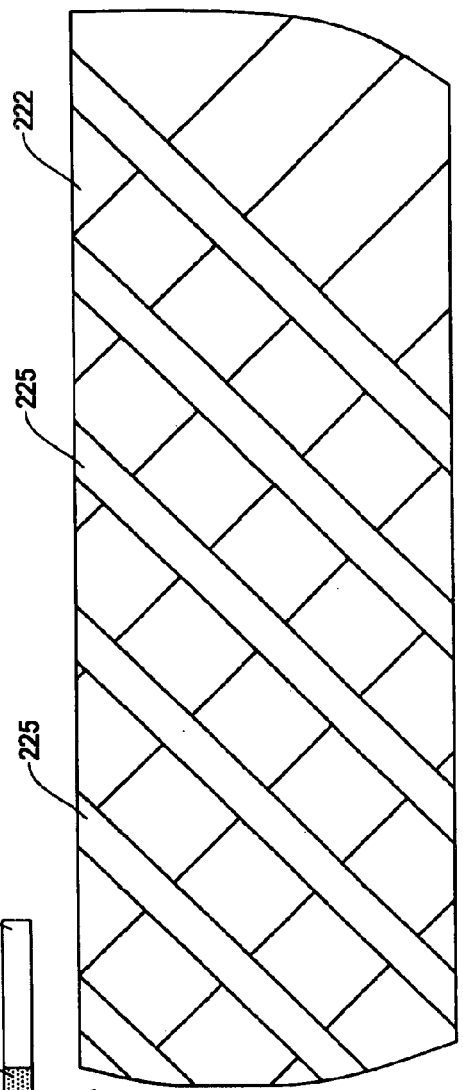
Fig. 25D

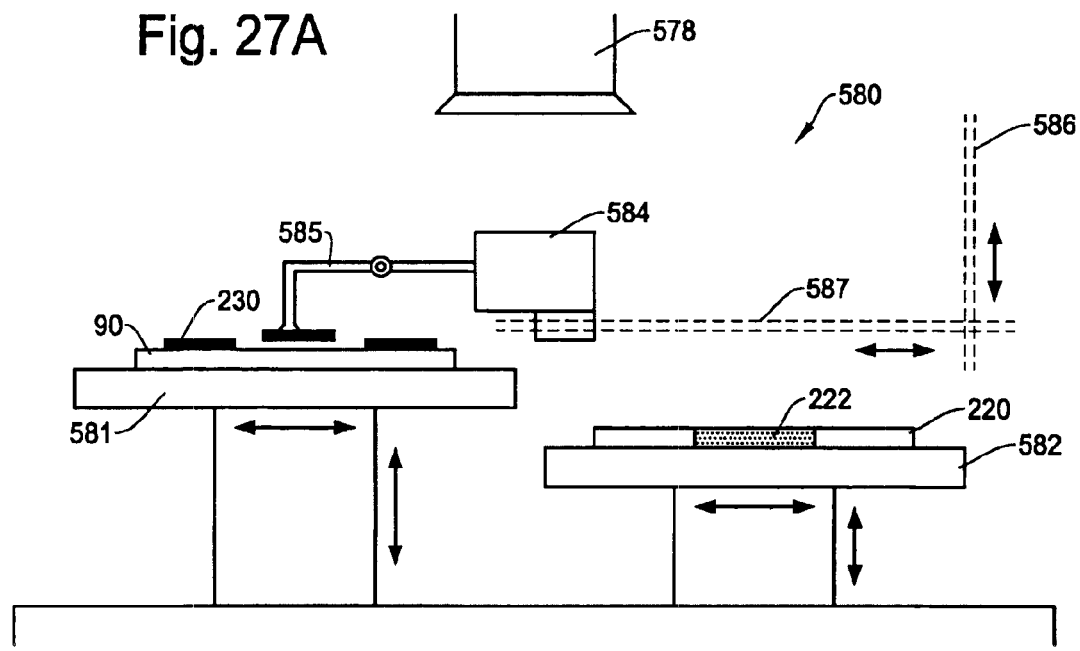
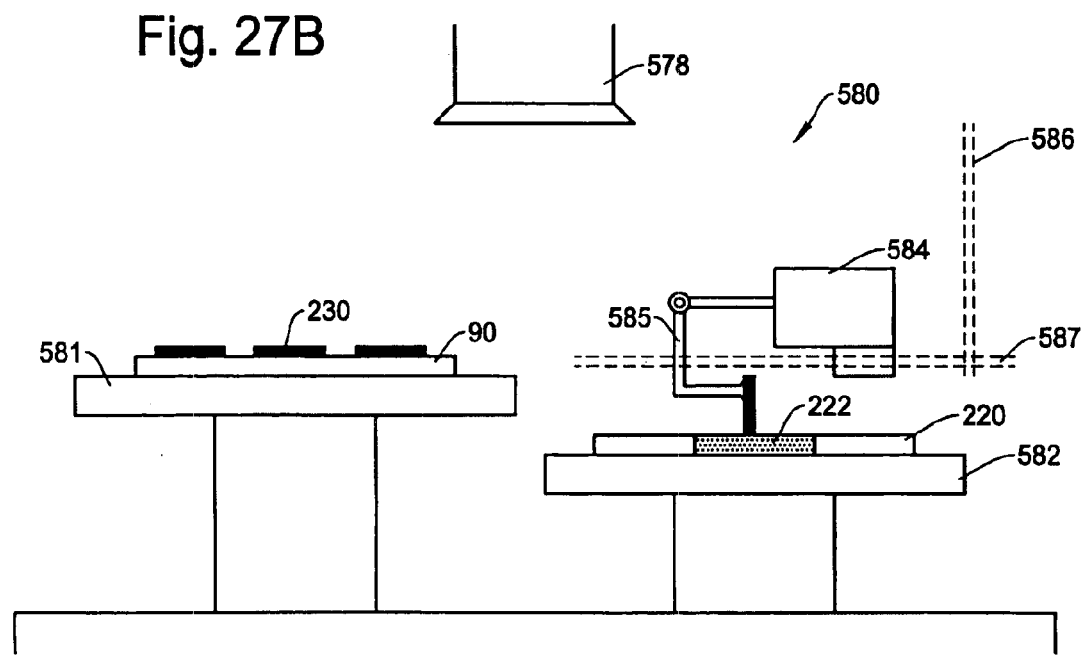

CONTACT STRUCTURE AND PRODUCTION METHOD THEREOF AND PROBE CONTACT ASSEMBLY USING SAME

This application claims the benefit of U.S. Provisional Application No. 60/417,716 filed Oct. 10, 2002.

FIELD OF THE INVENTION

This invention relates to a contact structure and a production method thereof and a probe contact assembly using the contact structure, and more particularly, to a contact structure using a plurality of cantilever contactors mounted on diagonal through holes of a contactor carrier to form a probe contact assembly for testing a semiconductor device, an IC chip, a semiconductor wafer, etc.

BACKGROUND OF THE INVENTION

In testing high density and high speed electrical devices such as IC and LSI circuits, a high performance contact structure such as a probe contact assembly having a large number of contactors must be used. The present invention is directed to a contact structure and a probe contact assembly using such a contact structure. The present invention is also directed to a production process of the contact structure and the probe contact assembly. The contact structure is used in combination with a test system for testing and burning-in IC and LSI chips, semiconductor wafers, packaged semiconductor devices, printed circuit boards and the like.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals from the wafer are compared with expected data to determine whether the IC circuits on the semiconductor wafer function correctly.

Referring to FIGS. 1 and 2, the test head 100 and the substrate handler 400 are connected through an interface component 140 consisting of a performance board 120 which is a printed circuit board having electric circuit connections unique to a test head's electrical footprint, coaxial cables, pogo-pins and connectors. The test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120.

A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIG. 2, the test head 100 is positioned over the substrate handler 400 and connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or pads in the IC circuit on the semiconductor wafer 300 under test.

Electrodes (contact pads) of the probe card 170 are electrically connected to the contact pins (pogo-pins) 141 provided on the frog ring 130. The pogo-pins 141 are also connected to the contact terminals 121 of the performance board 120 through the coaxial cables 124 where each contact terminal 121 is connected to the corresponding printed circuit board (pin cards) 150 in the test head 100. Further, the printed circuit boards 150 are connected to the semiconductor test system through the cable 110 having, for example, several hundreds of inner cables.

Under this arrangement, the probe contactors 190 contact the surface (contact target) of the semiconductor wafer 300 on the chuck 180 to apply test signals to the semiconductor wafer 300 and receive the resultant output signals from the wafer 300. As noted above, the resultant output signals from the semiconductor wafer 300 under test are compared with the expected data generated by the semiconductor test system to determine whether or not the IC circuits on the semiconductor wafer 300 performs correctly.

FIGS. 3–5 show examples of conventional contact structure and probe contact assembly using the contact structure. The contact structures in these examples are implemented by the same assignee of the present invention and have advantages and disadvantages. In these examples, identical reference numbers are used to denotes the same or similar components.

FIG. 3 is a cross sectional view showing an example of conventional probe contact system formed with a pogo-pin block 130, a probe card 260, and a contact structure having a contactor carrier 22 and contactors 30. In an application of semiconductor test, the contact structure is positioned, for example, over a semiconductor device such as a silicon wafer 300 to be tested. When the silicon wafer 300 is moved upward, the lower ends of the contactors 30 contact with contact pads 320 on the semiconductor wafer 300 to establish electrical communication therebetween.

In this example, the contactor carrier 20 is comprised of a system carrier 22 and a top retainer 24. The contactor carrier 20 is made of dielectric material such as silicon, polyimide, ceramic or glass. The system carrier 22 supports the top retainer 24 as well as creates a predetermined distance or space between the top retainer 24. The top retainer 24 and the system carrier 22 respectively have through holes for mounting the contactors 30.

Each contactor 30 has a top spring 32 having an upper end 33 oriented in a vertical direction, a bottom spring 36 having a lower end 35 oriented in a direction opposite to the upper end 33 and a body portion 37 between the top spring 32 and the bottom spring 36. At both sides of the body portion 37, stoppers 34 are provided to securely mount the contactor 30 on the contactor carrier 20. The top spring 32 is zig-zaged or provided with at least one diagonal beam portion between the top end 33 and the body portion 37 for producing a resilient contact force. The body portion 37 has a flat square shape as a whole having the stoppers 34 at both sides as noted above. The bottom spring 36 is zig-zaged or provided with at least one diagonal beam portion between the body portion 37 and the lower end 35 for producing a resilient contact force.

The probe card 260, pogo-pin block 130 and contact structure are mechanically as well as electronically connected with one another, thereby forming a probe contact assembly. Thus, electrical paths are created from the lower ends 35 (contact point) of the contactors 30 to the test head 100 through the cables 124 and the performance board 120 (FIG. 2). Thus, when the semiconductor wafer 300 and the probe contact assembly are pressed with each other, electrical communication will be established between the DUT (contact pads 320 on the wafer 300) and the test system.

The pogo-pin block (frog ring) 130 is equivalent to the one shown in FIG. 2 having a large number of pogo-pins to interface between the probe card 260 and the performance board 120. At upper ends of the pogo-pins, cables 124 such as coaxial cables are connected to transmit signals to printed circuit boards (pin cards) 150 in the test head 100 in FIG. 2 through the performance board 120. The probe card 260 has a large number of electrodes 262 and 265 on the upper and lower surfaces thereof.

When assembled, the top ends 33 of the contactors 30 contact the electrodes 262 of the probe card 260. The electrodes 262 and 265 are connected through interconnect traces 263 to fan-out the pitch of the contact structure to meet the pitch of the pogo-pins in the pogo-pin block 130. The top springs 32 of the contactors 30 produce resilient contact forces against the electrodes 262. When the contact structure is pressed against the semiconductor wafer 300, the bottom springs 36 of the contactors 30 produce resilient contact forces against the contact pads 320.

The conventional technology shown in FIG. 3 has a drawback in that the size of the zig-zaged spring of the contact limits the pitch or pin count of the contactors. Further, because the interconnection between the contactors and the probe card, or between the contactors and space transformer (not shown), is done through spring contacts, high reliability of interconnection is unavailable. Further, because of the relatively complicated structure, it is time consuming to adjust the planarity and alignment of the contact points of the contactors.

FIG. 4 shows another example of conventional probe contact assembly in which a contact structure is configured by a contactor carrier 20 and a plurality of contactors 30. In this example, the contactor carrier 20 is comprised of a system carrier 22, a top plate carrier 24, an intermediate plate carrier 26, and a bottom plate carrier 28. The contactor carrier 20 is made of dielectric material such as silicon, polyimide, ceramic or glass. The system carrier 22 supports the top, intermediate, and bottom plate carriers with predetermined space therebetween. The top plate carrier 24, the intermediate plate carrier 26 and the bottom plate carrier 28 respectively have through holes for mounting the contactors 30.

Each contactor 30 is composed of an upper end (base portion) 33, a diagonal beam (spring) portion 32, a straight beam portion 36, a lower end (contact portion) 35 and a return portion 37. Preferably, stoppers 34 and 38 are provided to each contactor 30 to securely mount the contactor 30 on the contactor carrier 20. The diagonal beam portion 32 diagonally extends between the upper end 33 and the straight beam portion 36.

The diagonal beam (spring) portion 32 of the contactor 30 functions as a spring to produce a resilient force when the upper end 33 contact the probe card 260 and the lower end 35 is pressed against the contact target. The straight beam portion 36 extends downwardly between the diagonal beam portion 32 and the lower end 35. The upper end 33 and the lower end 35 function as contact points to establish electrical communication with other components. The lower end 35 functions to contact with a contact target such as the contact pad 320 on the semiconductor wafer 300.

The return portion 37 runs upwardly from the lower end 35 in parallel with the straight beam portion 36. In other words, the return portion 37 and the straight beam portion 36 constitute a space (gap) S therebetween at about a position inserted in the through hole of the bottom plate carrier 28. This structure ensures a sufficient width with respect to the through holes on the bottom plate carrier 28 and allows flexibility when deforming the contactor 30. This is effective when the contactor is pressed against the contact target.

The conventional technology shown in FIG. 4 has a drawback in that it is not easy to assemble the contactors on the contactor carrier. Further, because the interconnection between the contactors and the probe card, or between the contactors and space transformer (not shown), is done through spring contacts, high reliability of interconnection is unavailable.

FIGS. 5A and 5B show a further example of conventional contactor structure where FIG. 5A is a cross sectional view and FIG. 5B is a bottom view of thereof. The contact structure is formed of contactors 30 and a contact substrate 20 mounting the contactors 30. The contact substrate 20 also functions as a space transformer. The contactor 30 has a conductive layer 35 in a finger (beam) like shape. The contactor 30 also has a base 40 which is attached to the contact substrate 20. An interconnect trace 24 is connected to the conductive layer 35 at a bottom surface of the contact substrate 20. Such a connection between the interconnect trace 24 and the conductive layer 35 is made, for example, through a solder ball (not shown).

The contact substrate 20 further includes a via hole 23 and an electrode 22. The electrode 22 is to interconnect the contact substrate 20 to an external structure such as a probe card or IC package through a wire or lead. In this example, adhesives 45 are used to bond the contactors 30 to the surface of the contact substrate 20 at the sides of the set of the contactors 30 as well as at the corners formed by the silicon base 40 and the contact substrate 20. Because of the spring force of the beam like shape of the contactor 30 mounted in a diagonal direction on the contact substrate 20, the end of the conductive layer 35 produces a resilient contact force when the semiconductor wafer 300 is pressed against the contact structure.

The conventional technology shown in FIG. 5 has a drawback in that since a line of multiple beams of the contactors 30 is produced in a comb like shape through an anisotropic etching process, such a comb like series of contactors are not suitable for an array pattern of contact probe.

SUMMARY OF THE INVENTION

Therefore, it is an object of the present invention to provide a contact structure having a large number of contactors for electrically contacting with contact targets with high frequency bandwidth, small pin pitch and high pin count capability, and high contact performance as well as high reliability.

It is another object of the present invention to provide a contact structure formed of a contactor carrier and a plurality of cantilever contactors where the cantilever contactors are easily and securely mounted on the contactor carrier.

It is a further object of the present invention to provide a contact structure in which the cantilever contactor has a simple shape with a straight and short diagonal beam, an upper beam of which is secured in the diagonal through hole of the contactor carrier and the lower beam is projected from the contactor carrier to achieve a high spring rate, high pitch and pin count, high frequency range, and high over drive capability.

It is a further object of the present invention to provide a probe contact assembly using the contact structure of the present invention in which the components are connected through a flip chip bonding technology and an adhesive under fill method, thereby achieving components interconnection with high reliability.

It is a further object of the present invention to provide a method for producing a large number of contactors in a two dimensional manner on a silicon substrate, removing the contactors from the substrate and mounting the contactors on a contact substrate in a three dimensional manner to form the contact structure.

In the present invention, a contact structure is formed of a large number of contactors and a contactor carrier. The contactors are produced on a planar surface of a dielectric substrate such as a silicon substrate by a photolithography technology and removed from the substrate and mounted on the contactor carrier. The contact structure of the present invention is advantageously applied to testing and burning-in semiconductor devices, such as LSI and VLSI chips, semiconductor wafers and dice, packaged ICs, printed circuit boards and the like. The contact structure of the present invention can also be used as components of electronics devices such as IC leads and pins.

The first aspect of the present invention is a contact structure for establishing electrical connection with contact targets. The contact structure is formed of a contactor carrier and a plurality of contactors. The contactors are mounted on the contactor carrier in diagonal through holes. The contactor has a top end having a flat top surface, a straight diagonal beam integral with the top end and configured by an upper beam portion and a lower beam portion, and a lower end at an end of the lower beam portion to contact with a contact target.

Another aspect of the present invention is a method of producing the contactors in a two dimensional manner on a silicon substrate and removing therefrom for establishing a contact structure. The production method is comprised of the following steps of:

(a) forming a sacrificial layer on a surface of a substrate;

(b) forming a photoresist layer on the sacrificial layer;

(c) aligning a photo mask over the photoresist layer and exposing the photoresist layer with ultraviolet light through the photo mask, the photo mask including an image of the contactors;

(d) developing patterns of the image of the contactors on a surface of the photoresist layer;

(e) forming the contactors made of conductive material in the patterns on the photoresist layer by depositing the conductive material, each of the contactors having a top end with a flat top surface, a diagonal straight beam integral with the top end and configured by an upper beam portion and a lower beam portion, and a lower end at an end of the lower beam portion;

(f) stripping the photoresist layer off;

(g) removing the sacrificial layer by an etching process so that the contactors are separated from the silicon substrate; and (h) mounting the contactors on a contactor carrier by inserting the contactors in diagonal through holes form on the contactor carrier.

A further aspect of the present invention is a probe contact assembly including the contact structure of the present invention. The probe contact assembly is formed of a contactor carrier mounting a plurality of contactors in a manner that diagonal straight beams of the contactors are inserted in diagonal through holes on the contactor carrier and attached to the contactor carrier by an adhesive; a probe card for establishing electrical communication between electrodes provided on the probe card and a test semiconductor system through mechanical contact pins; and a space transformer provided between the contactor carrier and the probe card for changing a pitch of the contactors to a pitch of the probe card. Each of the contactors is comprised of a top end having a flat top surface, a straight diagonal beam integral with the top end and configured by an upper beam portion and a lower beam portion, and a lower end at an end of the lower beam portion to contact with a contact target.

According to the present invention, the contact structure has very high capabilities in various aspects to meet the test requirements of the next generation semiconductor technology. The cantilever contactors are easily and securely mounted on the contactor carrier in the diagonal through holes. The cantilever contactor has a simple shape with a straight and short diagonal beam, an upper beam of which is secured in the diagonal through hole of the contactor carrier and the lower beam is projected from the contactor carrier and functions as a spring, resulting in a high spring rate, high pitch and pin count, high frequency range, and high over drive capability. Because of the probe contact assembly incorporating the contact structure of the present invention is formed by mounting the contact structure and other components through the flip chip bonding, high reliability, high electrical current capability, and low contact resistance can be achieved.

Since the large number of cantilever contactors are produced at the same time on the substrate without involving manual handling, it is possible to achieve consistent quality, high reliability and long life in the contact performance as well as low cost. Further, according to the present invention, the production process is able to produce a large number of contactors in a horizontal direction on the silicon substrate by using relatively simple technique. The contact structure produced by the present invention are low cost and high efficiency and have high mechanical strength and reliability.

BRIEF DESCRIPTION OF THE DRAWINGS

FIG. 7A is a cross sectional front view showing the contact structure and a space transformer of the present invention where the interconnection therebetween is made through flip chip bonding.

FIG. 9 is a cross sectional front view of the probe contact assembly using the contact structure and space transformer of the present invention where the interconnection between the probe card and the space transformer is made through flip chip bonding.

FIG. 10 is a cross sectional front view of the probe contact assembly using the contact structure and a flexible printed circuit board which functions as a space transformer and a probe card.

FIG. 11A is directed to linear tolerance of the cantilever contactor and FIG. 11B is directed to rotary tolerance of the cantilever contactor.

FIGS. 15A–15L are schematic diagrams showing an example of production process for producing the cantilever contactors of the present invention.

FIG. 18A is a front view of the cantilever contactor, FIG. 18B is a side view of the cantilever contactor, and FIG. 18C is a perspective view of the cantilever contactor.

FIGS. 19A–19C are diagrams showing details of the cantilever contactor of the present invention wherein an angle of cantilever is 45°. FIG. 19A is a front view of the cantilever contactor, FIG. 19B is a side view of the cantilever contactor, and FIG. 19C is a perspective view of the cantilever contactor.

FIGS. 20A–20C are diagrams showing details of the cantilever contactor of the present invention wherein an angle of cantilever is 60°. FIG. 20A is a front view of the cantilever contactor, FIG. 20B is a side view of the cantilever contactor, and FIG. 20C is a perspective view of the cantilever contactor.

FIG. 21A is a front view of the cantilever contactor, and FIG. 21B is a side view of the cantilever contactor.

FIG. 22A is a front view of the cantilever contactor, and FIG. 22B is a side view of the cantilever contactor.

FIG. 23 shows a data table comparing properties and capabilities of the cantilever contactor of the present invention with different angles of the cantilever.

FIG. 24 is a cross sectional view showing the contactor carrier in the contact structure of the present invention having diagonal through holes for mounting the contactors in 45° relative to the surface thereof.

FIGS. 25A–25D are diagrams showing an example of structure of the contactor carrier in the contact structure of the present invention where FIG. 25A is a top view, FIG. 25B is a cross sectional view, FIG. 25C is an enlarged top to view, and FIG. 25D is an enlarged cross sectional view, respectively.

FIGS. 27A and 27B are schematic diagrams showing an example of pick and place mechanism and its process for picking the cantilever contactors and placing the same on a contactor carrier to produce the contact structure of the present invention.

DETAILED DESCRIPTION OF THE INVENTION

Figure 6:
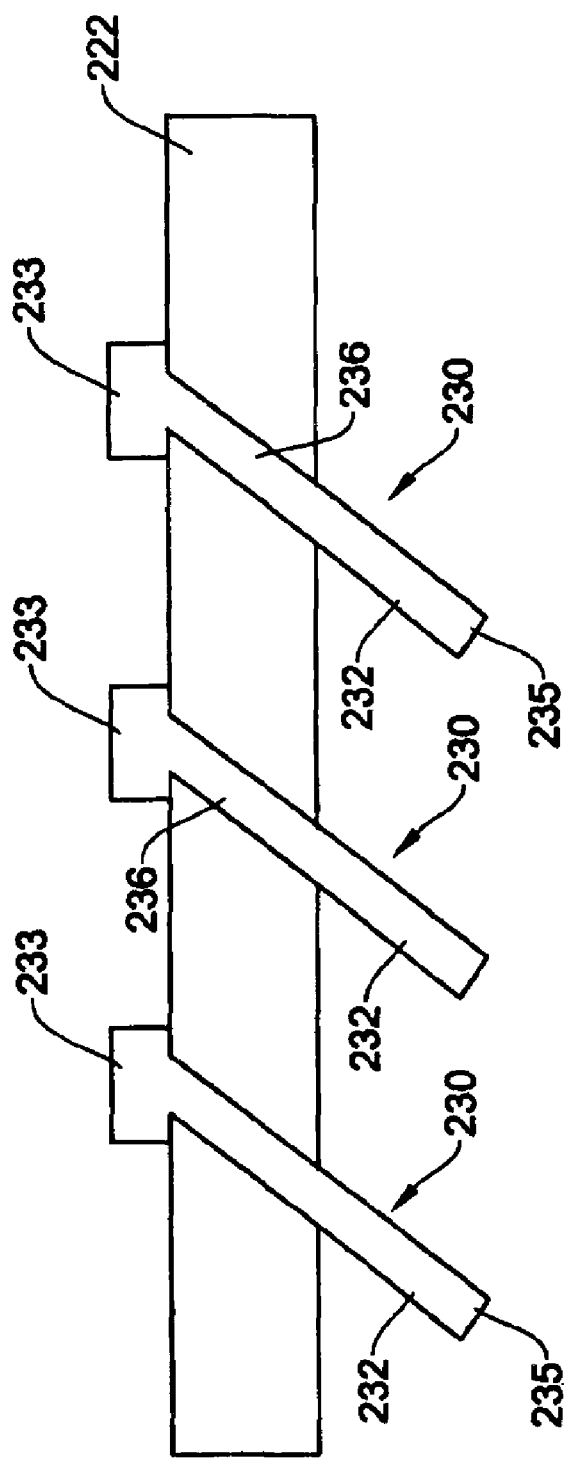
FIG. 6 is a schematic diagram showing a basic configuration of the contact structure of the present invention in which a plurality of contactors of cantilever shape are mounted on a contactor carrier through corresponding diagonal through holes.

The present invention will now be explained in detail with reference to the accompanying drawings. FIG. 6 is a cross sectional view showing an example of contact structure of the present invention. The contact structure is configured by a contactor carrier 222, and a plurality of cantilever contactors 230. Each cantilever contactor 230 is extended in the diagonal direction and is mounted in a diagonal through hole of the contactor carrier 222.

The contactor carrier 222 is made of nonconductive, rigid material such as ceramic, silicon nitride or sapphire. The contactors 230 are made of conductive material such as nickel-cobalt (NiCo) or nonconductive material coated with such conductive material. Although only three contactors are shown, in an actual implementation, a large number of cantilever contactors 230 are mounted on the contactor carrier 222.

In FIG. 6, each contactor 230 is composed of a top end (base portion) 233 having a flat top surface, a diagonal beam portion formed of a lower beam 232 and an upper beam 236, and a lower end (contact portion) 235. The cantilever contactors 230 are inserted in the diagonal through holes formed on the contactor carrier 222. The top end 233 has a size larger than that of the through hole of the contactor carrier 222, thus, works as a stopper when the cantilever contactor 230 is inserted therein. The upper beam 236 is secured in the diagonal through hole and the top end 233 is fitted with the upper surface of the contact carrier 222. Preferably, the cantilever contactor 230 is attached to the contactor carrier 222 through an adhesive.

The lower beam 232 is projected in the air from the lower surface of the contact carrier 222 to function as a spring which produces a resilient contact force when the lower end 235 is pressed against the contact target. As will be described in detail later with reference to FIGS. 18A–20B, the cantilever contactor 230 has a predetermined angle, preferably 45° relative to the horizontal surface of the contactor carrier 222, which shows excellent contact performances including the spring function. The lower end 235 directly contacts with the contact target, thus, it is preferable that the lower end 235 is sharpened to achieve an improved contact performance by scrubbing a surface of the contact target.

FIG. 7A is a cross sectional view of the contact structure of the present invention and a space transformer for use in a probe contact assembly. The contact structure having the contactor carrier 222 and the cantilever contactors 230 is the same as that shown in FIG. 6. The space transformer 250 is to transform (fan-out) the pitch of the contactors 230 to a larger pitch to match with electrodes (input terminals) on a probe card (FIGS. 8 and 9) or on a flexible PCB (FIG. 10). Thus, the space transformer 250 has solder bumps 255, interconnects 253 and upper electrodes 257 to enlarge the pitch between the solder bumps 255 to the pitch between the electrodes 257. Typically, the space transformer is made of a multi-layer ceramic substrate with signal patterns.

In this example, the space transformer 250 has the solder bumps 255 for flip chip bonding to the top ends 233 of the cantilever contactors 230. It is also possible to incorporate lower electrodes in lieu of the solder bumps 255, to establish electrical connection between the contactors 230 and the space transformer 250 by pressing with one another. However, the connection through the solder reflow through the flip chip bonding is preferable to achieve the interconnection with low contact resistance, and high reliability, stability and quality.

In the flip chip bonding, solder bumps 255 are created on the bottom surface of the space transformer 250 which are connected to the interconnects 253. The space transformer 250 is placed on the contactor carrier 222 to match the positions of the solder bumps 255 and the top ends 233 of the cantilever contactor 230. By heating the surrounding area to cause the reflow of the solder bumps 255, the top ends 233 of the contactor 230 and the solder bumps 255 are bonded to one another.

Figure 7B:
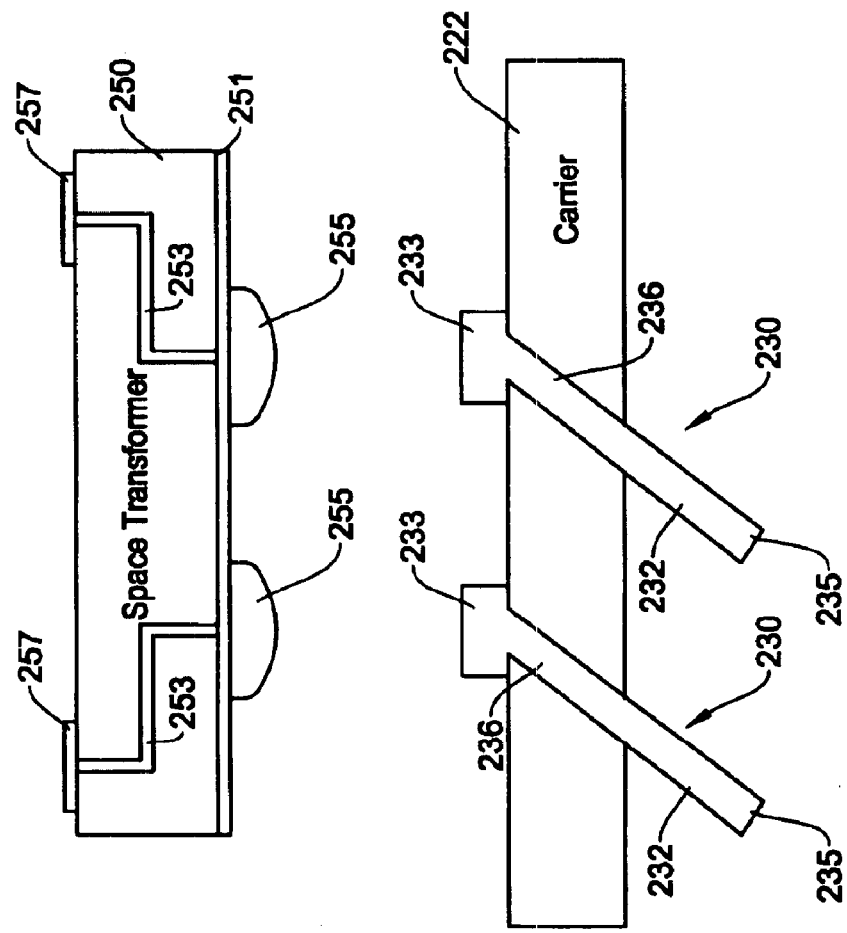
FIG. 7B is cross sectional front view of the modified version of the space transformer of FIG. 7A where a multi-layer organic substrate is attached to the ceramic substrate.

FIG. 7B shows a cross sectional view of the contact structure and the space transformer of the present invention similar to that shown in FIG. 7A. The difference from the example of FIG. 7A is that the space transformer is formed by the ceramic space transformer 250 and a multi-layer organic flip chip carrier 251 which is attached to the bottom of the ceramic substrate 250. The multi-layer organic flip chip carrier 251 has a multi-layer of circuit patterns to transform the space of the contactors to the wider pitch of the electrodes on the upper surface of the space transformer 250.

The multi-layer organic flip chip carrier 251 is preferably designed to establish a circuit pattern unique to a particular customer while the ceramic substrate 250 has a standard circuit pattern. It is possible to achieve the space transformer circuit patterns more quickly and inexpensively than the example of FIG. 7A by forming the customer specific circuit patterns only on the multi-layer organic flip chip carrier 251. Further, the multi-layer organic flip chip carrier 251 can be removed and fabricated again on the same ceramic substrate 250 to create new circuit patterns for repair, design change, etc.

Figure 8:
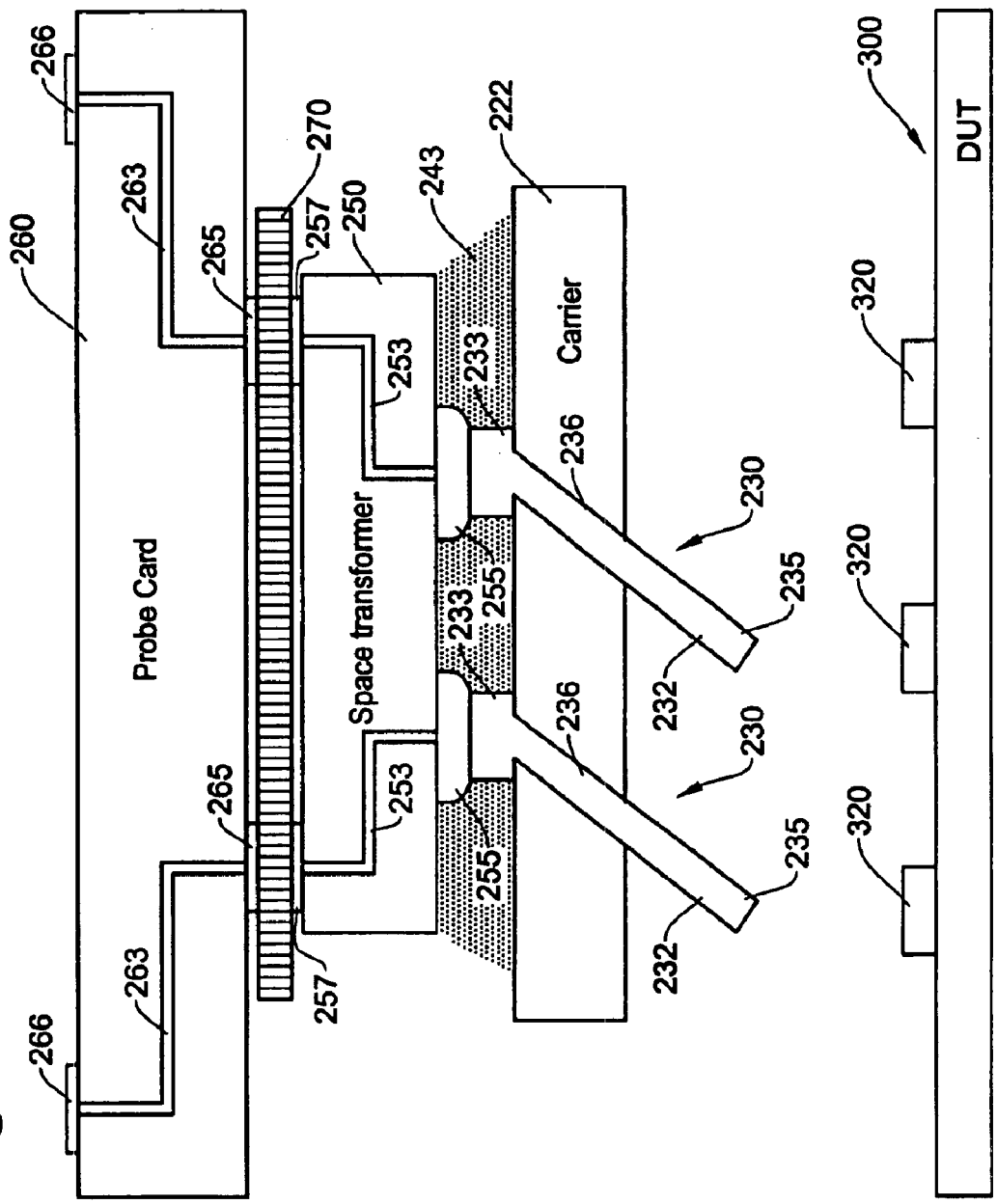
FIG. 8 is a cross sectional front view of the probe contact assembly using the contact structure and space transformer of the present invention shown in FIG. 7A where a conductive elastomer is provided between the space transformer and a probe card.

FIG. 8 is a cross sectional view showing an example of structure of a probe contact assembly of the present invention. As described above with reference to FIG. 7A, the contact structure (contactor carrier 222 and cantilever contactors 230) and the space transformer 250 are connected with one another through the flip chip bonding. To achieve interconnections in the probe contact assembly with high reliability and stability, an adhesive 243 is applied (under filled) in the space created between the space transformer 250 and the contactor carrier 222.

The example of FIG. 8 further shows a semiconductor wafer 300 as a device under test (contact target), a probe card 260, and a conductive elastomer 270 between the probe card 260 and the space transformer 250. When the semiconductor wafer 300 is moved upward, the lower ends 235 of the contactors 230 contact with contact pads 320 on the semiconductor wafer 300 to establish electrical communication therebetween.

Figure 1:
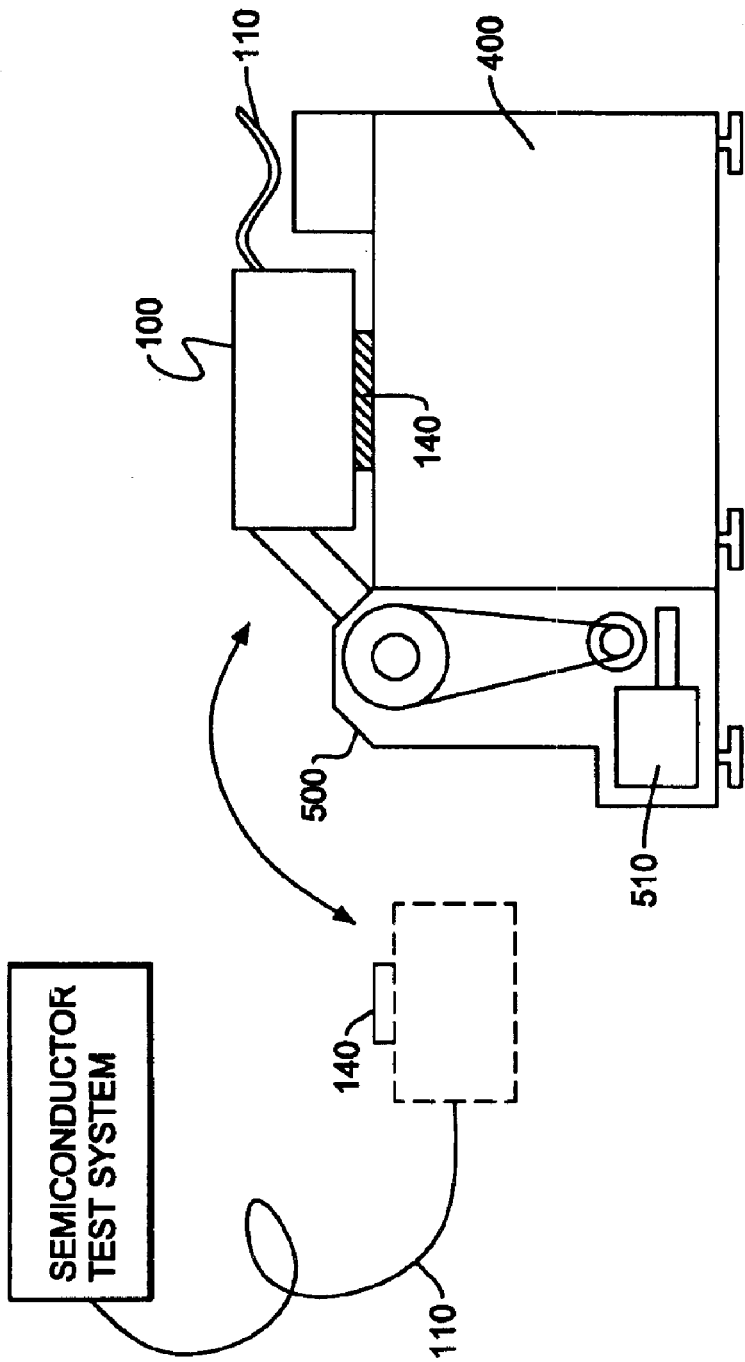
FIG. 1 is a schematic diagram showing a structural relationship between a substrate handler and a semiconductor test system having a test head.
Figure 2:
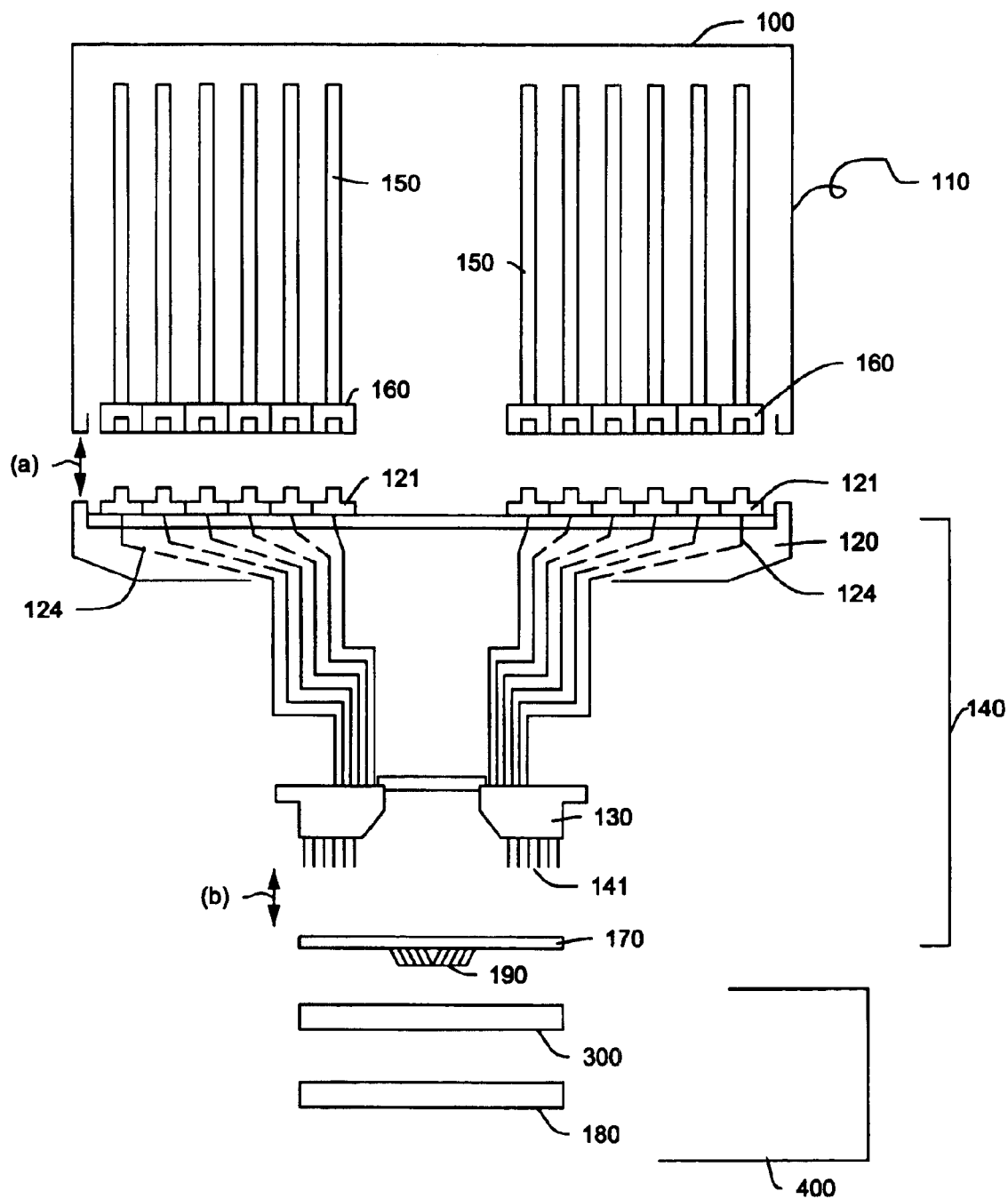
FIG. 2 is a diagram showing an example of more detailed structure for connecting the test head of the semiconductor test system to the substrate handler through an interface component.
Figure 3:
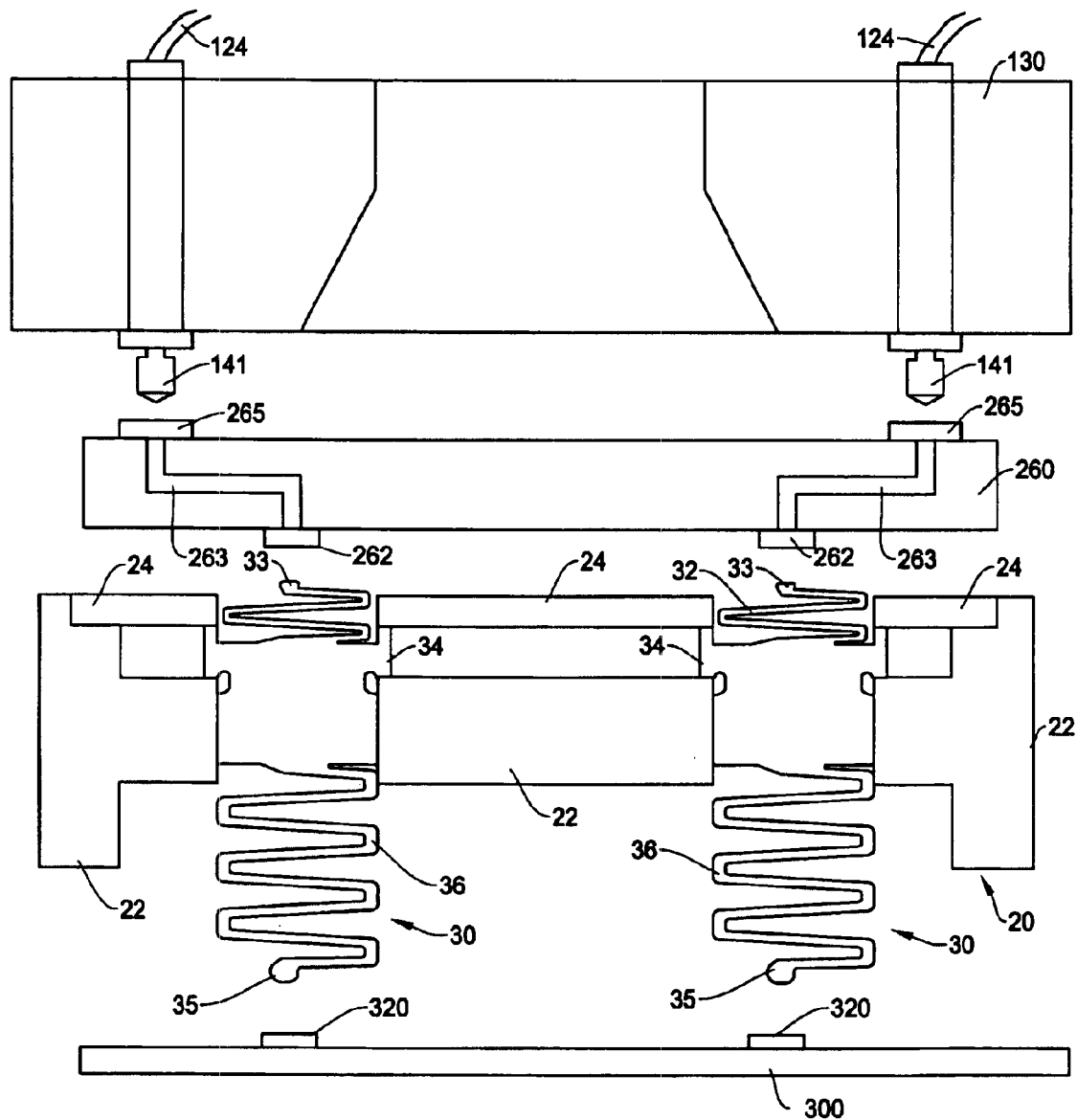
FIG. 3 is a cross sectional front view showing an example of conventional contact structure and probe contact assembly using the conventional contact structure.
Figure 4:
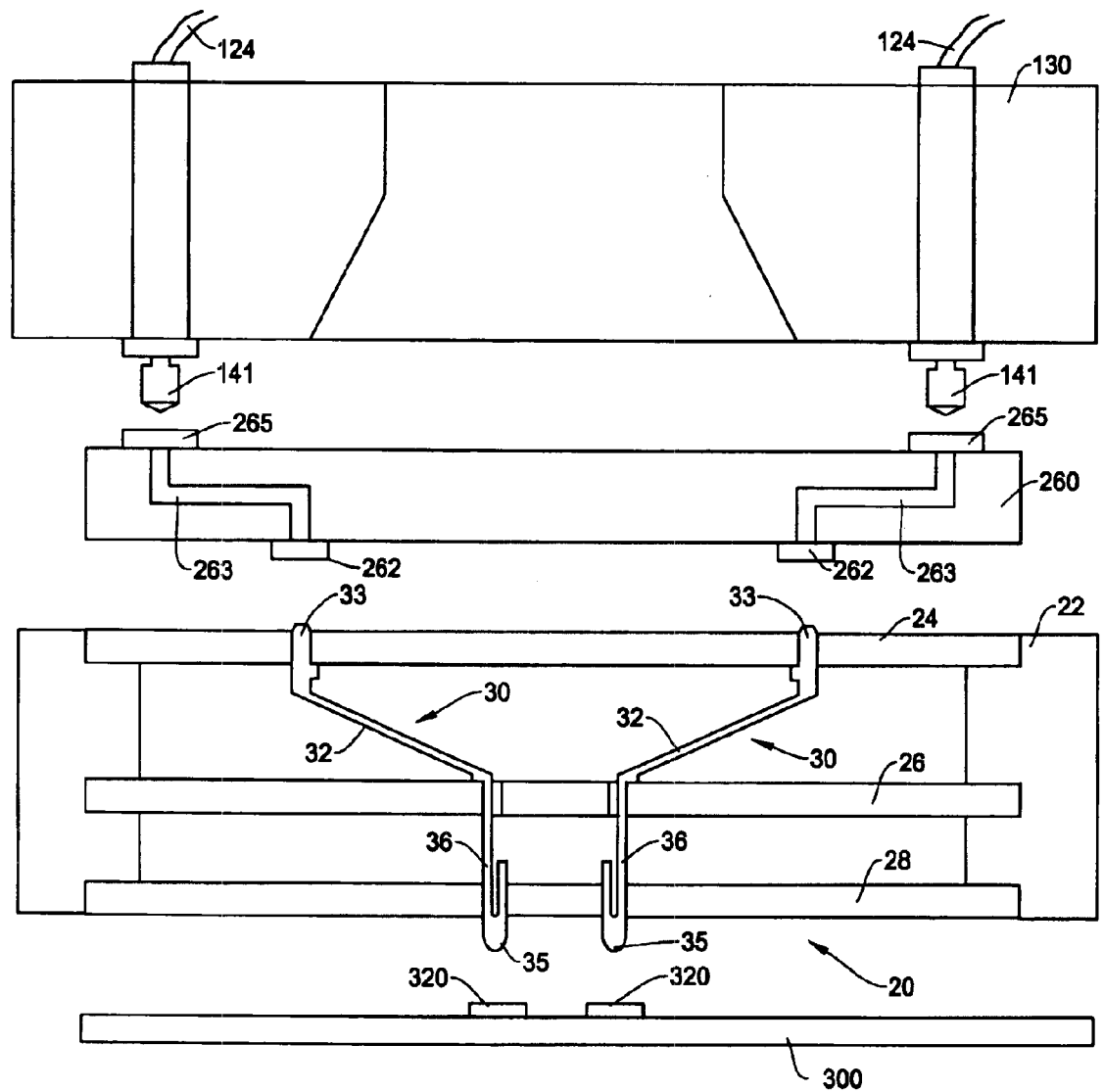
FIG. 4 is a cross sectional front view showing another example of conventional contact structure and probe contact assembly using the conventional contact structure.
Figure 5A:
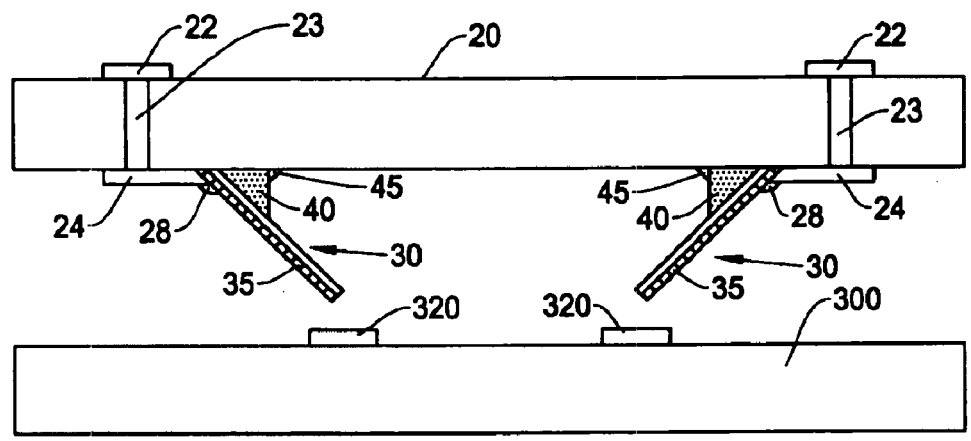
FIG. 5A is a cross sectional front view showing a further example of conventional contact structure and FIG. 5B is a bottom view of the contact structure of FIG. 5A.
Figure 5B:
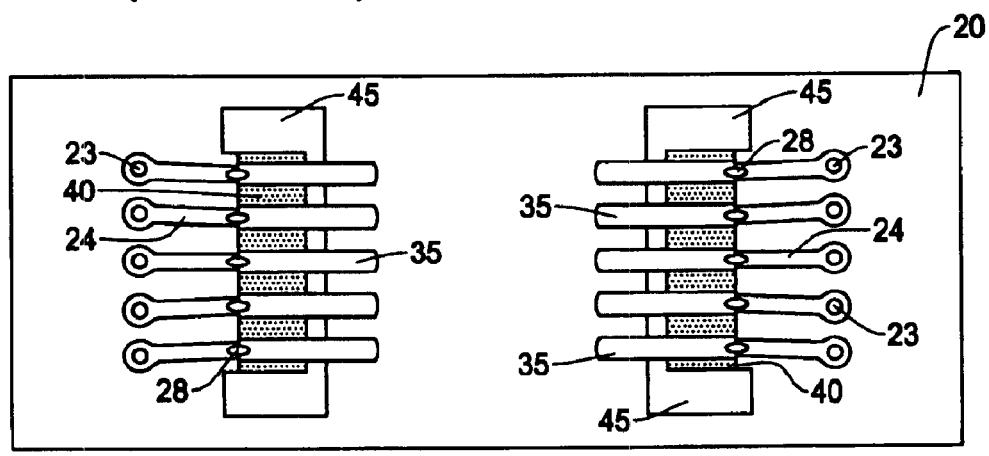

The probe card 260 is basically the same as that shown in the conventional technology of FIGS. 3 and 4 and has electrodes 265 and 266 and interconnects 263. Typically, pogo-pins or other mechanical pins contact the upper electrodes 266 to electrically connect the probe card 260 to the test head (pin cards) of the test system as shown in FIG. 2. For this purpose, the probe card 260 fan-out the pitch of the electrodes 257 on the space transformer 250 to a pitch of the pogo-pins by the interconnects (signal patterns) 263, and the electrodes 265 and 266.

The conductive elastomer 270 is provided between the space transformer 250 and the probe card 260. When assembled, the upper electrodes 257 on the space transformer 250 and the lower electrodes 265 on the probe card 260 are electrically connected through the conductive elastomer 270. The conductive elastomer 270 is an elastic sheet having a large number of conductive wires in a vertical direction. For example, the conductive elastomer 270 is comprised of a silicon rubber sheet and a multiple rows of metal filaments. The metal filaments (wires) are provided in the vertical direction of FIG. 8, i.e., orthogonal to the horizontal sheet of the conductive elastomer 270. An example of pitch between the metal filaments is 0.02 mm or less and thickness of the silicon rubber sheet is about 0.2 mm and is available in the market.

FIG. 9 is a cross sectional view showing another example of structure of a probe contact assembly of the present invention. The difference from that of FIG. 8 is that the connection between the probe card 260 and the space transformer 250 is achieved through the flip chip bonding in the manner similar to the connection between the contact structure and the space transformer 250. Solder bumps 275 are formed on the probe card 260 in advance and are positioned on the electrodes 257 on the space transformer 250 and heated for reflow, thereby bonding the solder bumps 275 to the electrodes 257.

Similar to the example of FIG. 8, an adhesive 243 is applied (under filled) to the space created between the space transformer 250 and the contactor carrier 222. Further, an adhesive 246 is applied to the space created between the space transformer 250 and the probe card 260. Since the connection between the probe card 260 and the space transformer 250, and the connection between the space transformer 250 and the contactors 230 are made by the flip chip bonding and the adhesive under fill, reliable and stable interconnection with high current capacity and low connection resistance can be achieved.

FIG. 10 is a cross sectional view of a further example of structure of the probe contact assembly of the present invention. In this example, a flexible PCB (printed circuit board) 280 is used which replaces the probe card 260 and the space transformer 250 in the examples of FIGS. 8 and 9. A holding block 290 is provided to securely support the flexible PCB 280 in the probe contact assembly. The flexible PCB 280 has signal patterns which enlarge the pitch of the contactors 230 to the pitch of the pin cards in the test head. The flexible PCB 280 is directly connected to the pin cards in the test head (not shown), thus, it also eliminates the pogo-pins 141 and coaxial cables 124 in FIGS. 2–3.

In this example, the flexible PCB 280 and the cantilever contactors 230 are connected through the flip chip bonding. For this purpose, the solder bumps 285 are formed on the flexible PCB 280 in advance. In the same manner as described with reference to FIGS. 8 and 9, the solder bumps 285 are positioned on the top ends 233 of the cantilever contactors 230 and heated for reflow, thereby bonding the solder bumps 285 to the top ends 233 of the contactors 230. Similar to the examples of FIGS. 8 and 9, an adhesive 243 is under filled in the space created between the flexible PCB 280 and the contactor carrier 222. Since the probe card, space transformer, pogo-pins and coaxial cables in the other examples can be obviated, the configuration of FIG. 10 is able to dramatically reduce the overall cost of the probe contact assembly.

Figure 11A:
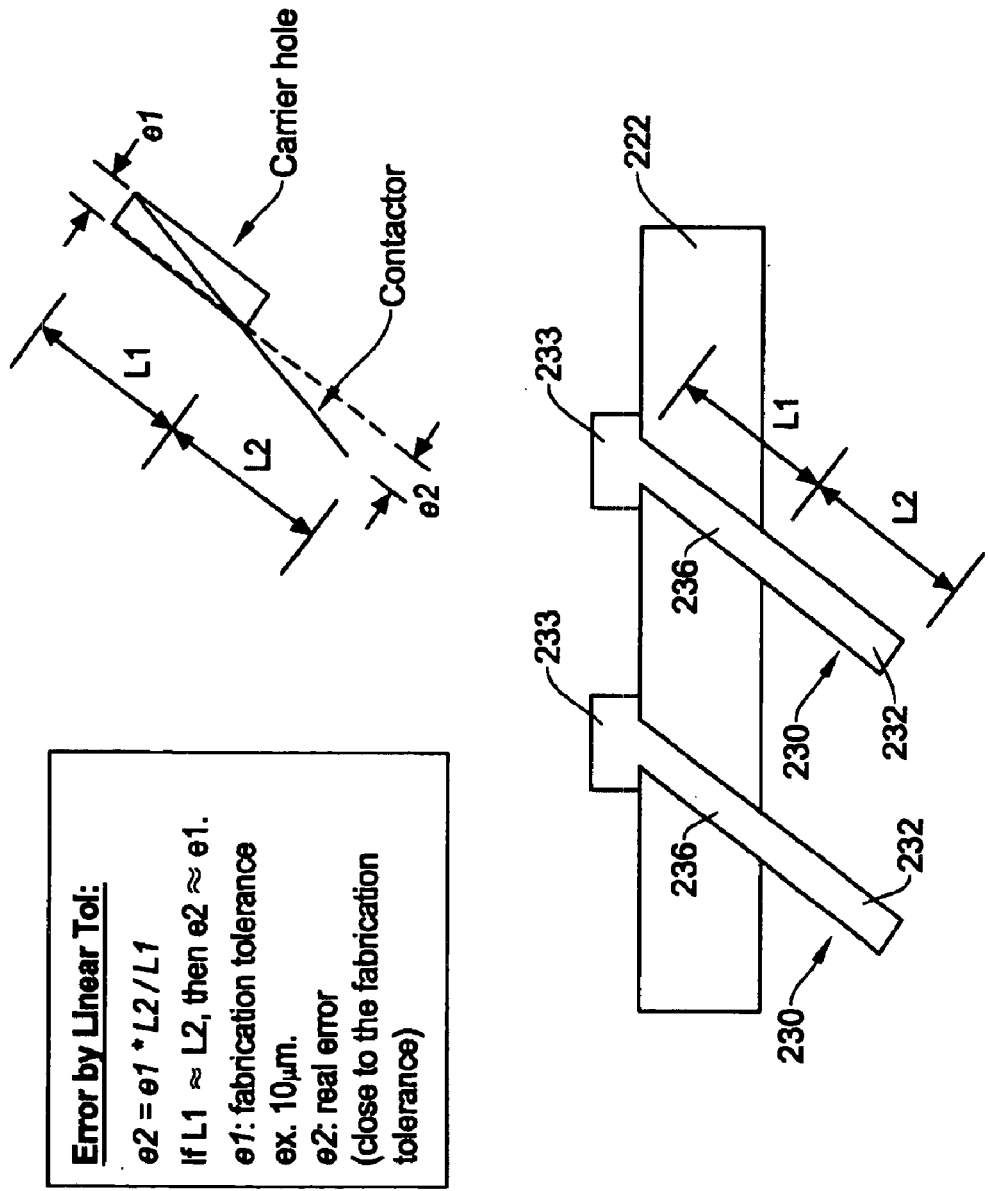
FIGS. 11A–11B are diagrams showing an error analysis involved in the contact structure of the present invention where
Figure 11B:
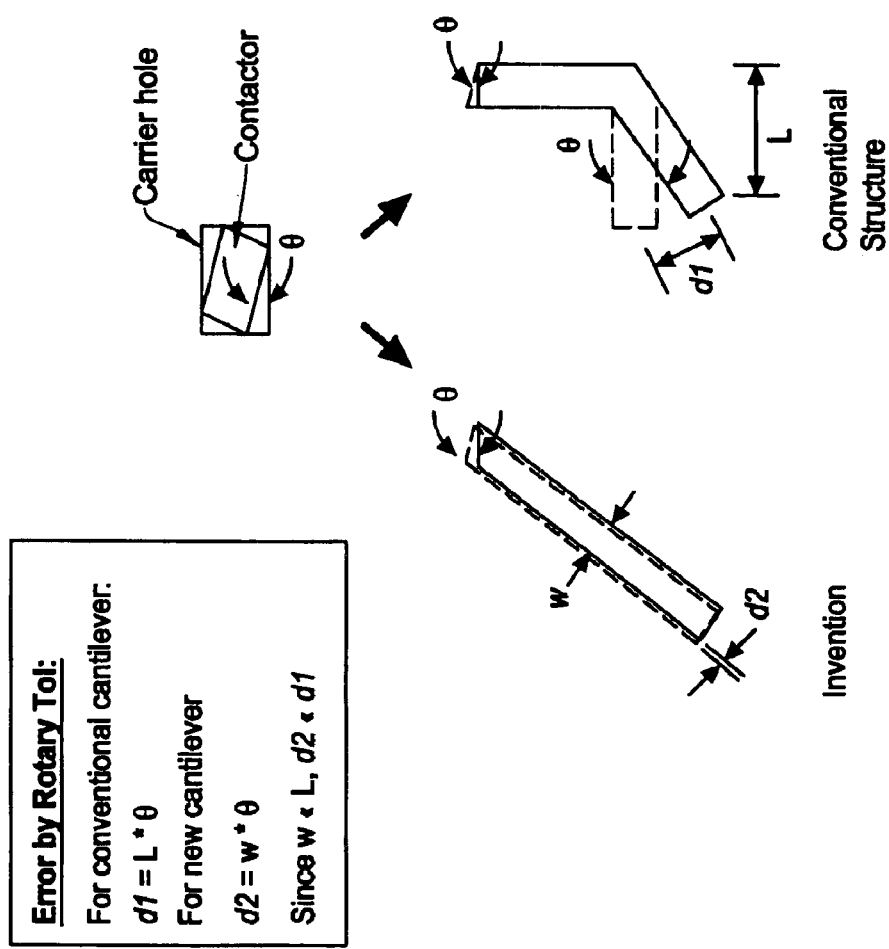

FIGS. 11A and 11B show positioning and alignment errors involved in the cantilever contactor of the present invention. This example shows results of examination regarding tolerance of the contact structure with respect to accurate positioning and alignment of the contact structure. An error by linear tolerance is shown in FIG. 11A. An error by rotational tolerance is shown in FIG. 11B.

In FIG. 11A, the fabrication tolerance e1 is a positioning error involved in the fabrication of the contact structure, which is typically a mismatch between the through hole on the contactor carrier 222 and the upper beam 236 of the cantilever contactor 230. The upper beam 236 is located within the through hole and the lower beam 232 is exposed to the air under the contactor carrier 222. In this situation, an real error e2 is expressed as e1·L2/L1, where L1 is a length of the upper beam and L2 is a length of the lower beam, and e1 is a fabrication error, for example 10 $\mu$m. Thus, in the case where L1 is equal or substantially equal to L2, the real error e2 is equal or substantially equal to the fabrication error e1 such as 10 $\mu$m.

In FIG. 11B, the rotational tolerance is a positioning error involved when the cantilever contactor is twisted when it is mounted in the through hole of the contactor carrier 222. In this example, the rotational tolerance is compared between the conventional cantilever contactor an the cantilever contactor of the present invention when the cantilever contractor is twisted by an angle $\theta$. Under this condition, the position change at the lower end of the contactor is evaluated.

In the typical conventional contactor, the upper beam is inserted in the contactor carrier in the direction vertical with the surface of the contactor carrier and the lower beam is projected from the lower surface of the contactor carrier in the diagonal direction. When the horizontal length of the lower beam is represented by L, the rotational tolerance d1 of the conventional cantilever contactor is expressed as d1=$\theta$L.

Since the cantilever contactor of the present invention is a straight beam, the rotational tolerance d2 is expressed as d2=$\theta$w, where w represents the width of the cantilever contactor which is typically 40 $\mu$m. Thus, when the rotation angle $\theta$ is 10°, the real error is about 4.4 $\mu$m. Since the width w of the new cantilever contactor is much smaller than the length L of the conventional cantilever contactor, the rotational tolerance of the cantilever contactor of the present invention is significantly smaller than that of the conventional cantilever contactor.

Figure 12:
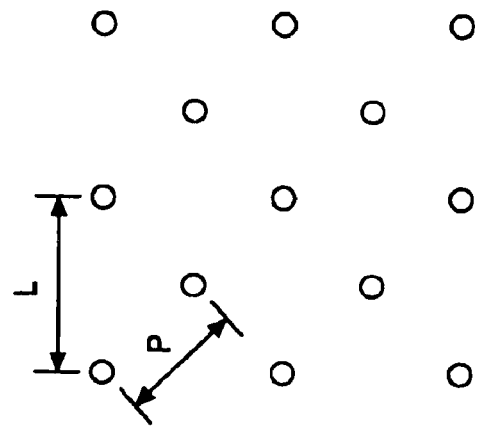
FIG. 12 is a diagram showing an example of array of the cantilever contactors on the contactor carrier in the contact structure of the present invention.

FIG. 12 is a schematic plan view of the contactor carrier in the contact structure of the present invention where locations for mounting the contactors are aligned in an array on the contactor carrier. Suppose the beams of the contactors are extended in the lower left or right direction, the pitch L between the contactors in the left-right direction is about 141 $\mu$m and the pitch P between the nearest contactors between the next row is about 100 $\mu$m. It should be noted that although the location of the contactor is expressed by a circle, an actual through hole for inserting the cantilever contactor preferably has a rectangular shape in plan view (FIG. 25).

Figure 13:
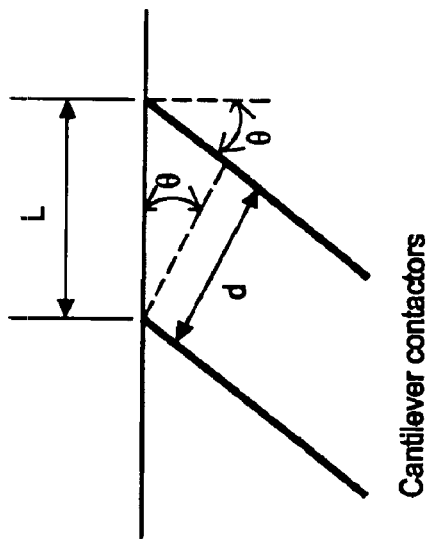
FIG. 13 is a diagram showing an example of angle and distance of the cantilever contactors on the contactor carrier in the contact structure of the present invention.

FIG. 13 is a schematic diagram of the contactors of the present invention showing the pitch between the contactors and the angle of the beam of the contactor. When the diagonal beam of the cantilever contactor has an angle $\theta$ relative to the vertical line as shown in FIG. 13, the distance d between the adjacent contactors is d=L·cos $\theta$, where L is the pitch between the two cantilever contactors in the same row. Thus, when the pitch L is 141 $\mu$m, the distance d is 122 $\mu$m if the angle $\theta$ is 30°, 99.7 $\mu$m if the angle $\theta$ is 45°, and 70.6 $\mu$m if the angle $\theta$ is 60°.

Figure 14A:
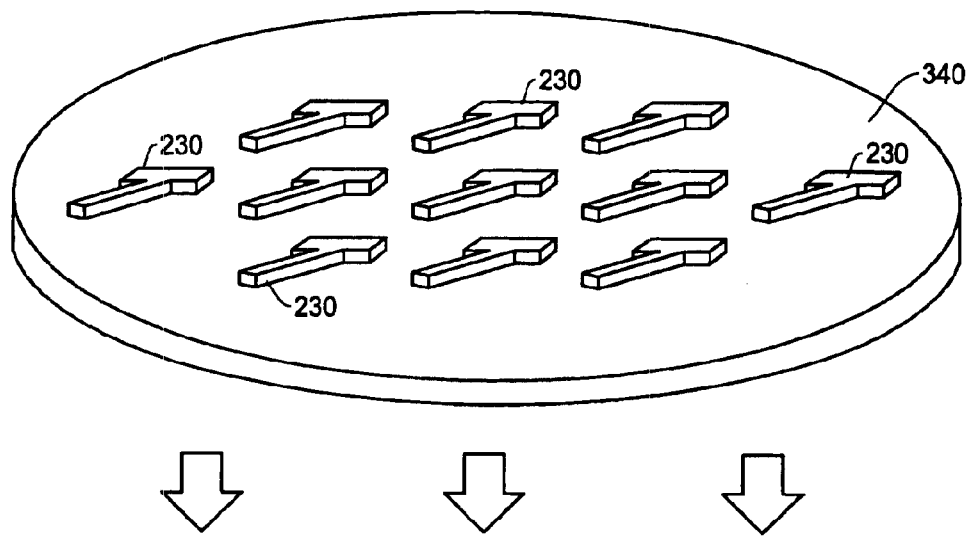
FIGS. 14A and 14B are schematic diagrams showing a basic concept of production method of the present invention in which a large number of cantilever contactors are formed on a planar surface of a substrate and removed therefrom for later processes.
Figure 14B:
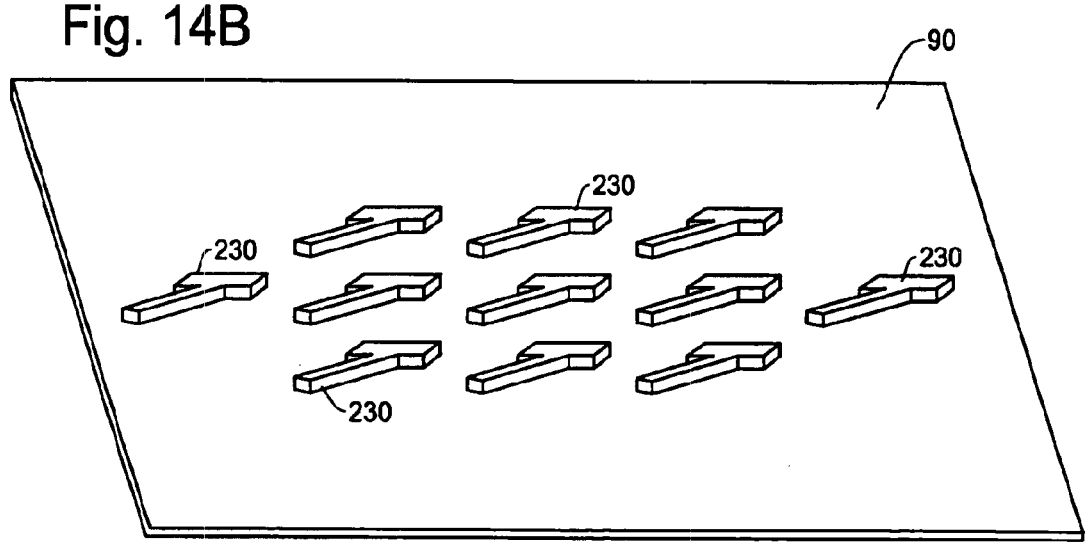

FIGS. 14A–14B show basic concepts for producing the cantilever contactors of the present invention. In the present invention, as shown in FIG. 14A, the cantilever contactors 230 are produced on a planar surface of a substrate 340 in a horizontal direction, i.e., in parallel with a planar surface of the substrate 340. In other words, the cantilever contactors 230 are built in a two dimensional manner on the substrate 340. Then, the cantilever contactors 230 are removed from the substrate 340 to be mounted on the contactor carrier 222 shown in FIGS. 6–10 in an diagonal direction, i.e., in a three dimensional manner. Typically, the substrate 340 is a silicon substrate although other substrates using dielectric material are also feasible.

The cantilever contactors 230 produced in the manner shown in FIG. 14A are removed and directly mounted on the contactor carrier 222 shown in FIGS. 6–10. Alternatively, in the example of FIG. 14B, the cantilever contactors 230 produced as shown in FIG. 14A are then transferred from the substrate 340 to an adhesive member 90, such as an adhesive tape, adhesive film or adhesive plate (collectively "adhesive tape"). In the further process, the cantilever contactors 230 on the adhesive tape 90 are removed therefrom to be mounted on the contactor carrier 222 of FIGS. 6–10 in an diagonal direction of the through holes on the contactor carrier 222, i.e., in a three dimensional manner with use, for example, of a pick and place mechanism.

Figure 15E:
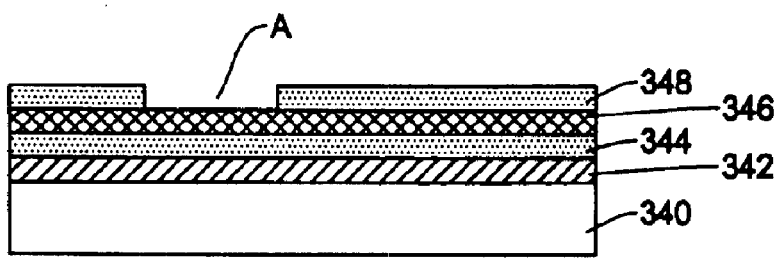

FIGS. 15A–15L are schematic diagrams showing an example of production process for producing the cantilever contactor 230 of the present invention. In FIG. 15A, a sacrificial layer 342 is formed on a substrate 340 which is typically a silicon substrate. Other substrate using dielectric material such as a glass substrate and a ceramic substrate is also feasible for this purpose. The sacrificial layer 342 is made, for example, of silicon dioxide ($SiO_2$) through a deposition process such as a chemical vapor deposition (CVD). The sacrificial layer 342 is to separate cantilever contactors 230 from the silicon substrate in the later stage of the production process.

An adhesion promoter layer 344 is formed on the sacrificial layer 342 as shown in FIG. 15B through, for example, an evaporation process. An example of material for the adhesion promoter layer 344 includes chromium (Cr) and titanium (Ti) with a thickness of about 200–1,000 angstrom, for example. The adhesion promoter layer 344 is to facilitate the adhesion of conductive layer 346 of FIG. 15C on the silicon substrate 340. The conductive layer 346 is made, for example, of copper (Cu) or nickel (Ni), with a thickness of about 1,000–5,000 angstrom, for example. The conductive layer 346 is to establish electrical conductivity for an electroplating process in the later stage.

Figure 15F:
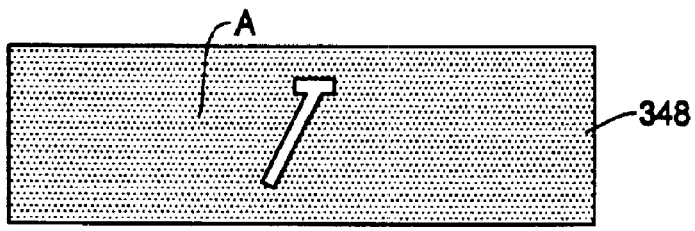

In the next process, a photoresist layer 348 is formed on the conductive layer 346 over which a photo mask 350 is precisely aligned to be exposed with ultraviolet (UV) light as shown in FIG. 15D. The photo mask 350 shows a two dimensional image of the cantilever contactor 230 which will be developed on the photoresist layer 348. As is well known in the art, positive as well as negative photoresist can be used for this purpose. If a positive acting resist is used, the photoresist covered by the opaque portions of the mask 350 hardens (cure) after the exposure. Examples of photoresist material include Novolak (M-Cresol-formaldehyde), PMMA (Poly Methyl Methacrylate), SU-8 and photo sensitive polyimide. In the development process, the exposed part of the photoresist 348 can be dissolved and washed away, leaving a photoresist layer 348 of FIG. 15E having an opening or pattern "A". Thus, the top view of FIG. 15F shows the pattern or opening "A" on the photoresist layer 348 having the image (shape) of the cantilever contactor 230.

In the photolithography process in the foregoing, instead of the UV light, it is also possible to expose the photoresist layer 348 with an electron beam or X-rays as is known in the art. Further, it is also possible to directly write the image of the contact structure on the photoresist layer 348 by exposing the photoresist 348 with a direct write electron beam, X-ray or light source (laser).

Figure 15G:
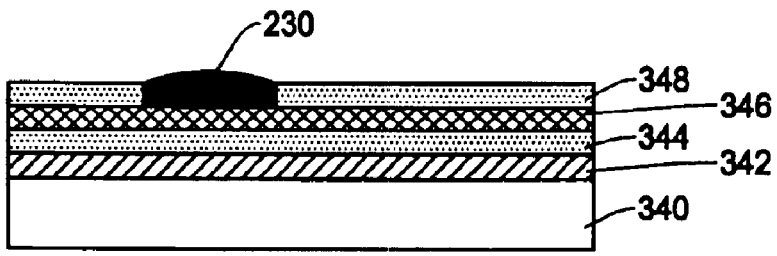
Figure 15H:
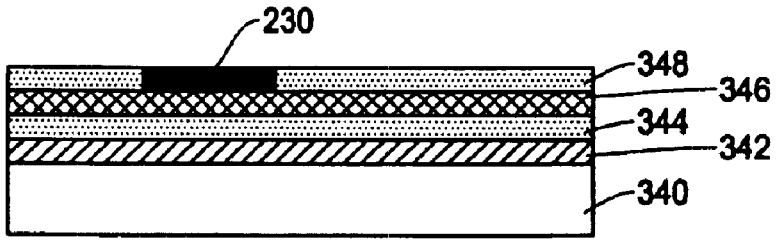

The conductive material such as copper (Cu), nickel (Ni), aluminum (Al), rhodium (Rh), palladium (Pd), tungsten (W) or other metal, nickel-cobalt (NiCo) or other alloy combinations thereof is deposited (electroplated) in the pattern "A" of the photoresist layer 348 to form the cantilever contactor 230 as shown in FIG. 15G. Preferably, a contact material which is different from that of the conductive layer 346 should be used to differentiate etching characteristics from one another as will be described later. The over plated portion of the cantilever contactor 230 in FIG. 15G is removed in the grinding (planarizing) process of FIG. 15H.

The above noted process may be repeated for producing contactors having different thickness by forming two or more conductive layers. For example, a certain portion of the cantilever contactor 230, such as the top end 233, may be designed to have a thickness larger than that of the other portions of the contactor. In such a case, after forming a first layer of the contactors (conductive material), if necessary, the processes of FIGS. 15D–15H will be repeated to form a second layer or further layers on the first layer of the contactors.

Figure 15I:
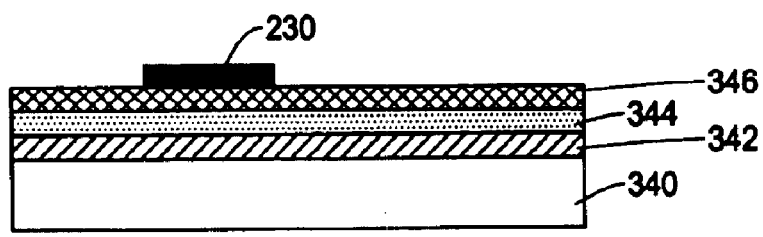
Figure 15J:
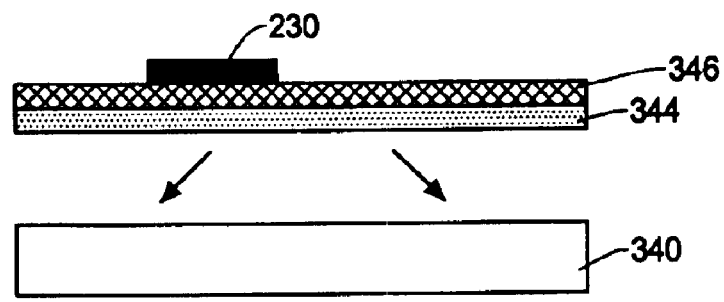
Figure 15K:
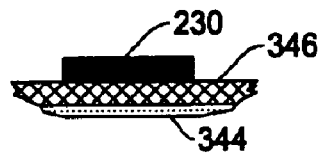
Figure 15L:

In the next process, the photoresist layer 348 is removed in a resist stripping process as shown in FIG. 15I. Typically, the photoresist layer 348 is removed by wet chemical processing. Other examples of stripping are acetone-based stripping and plasma $O_2$ stripping. In FIG. 15J, the sacrificial layer 342 is etched away so that the cantilever contactor 230 is separated from the silicon substrate 340. Another etching process is conducted so that the adhesion promoter layer 344 and the conductive layer 346 are removed from the cantilever contactor 230 as shown in FIG. 15K.

The etching condition can be selected to etch the layers 344 and 346 but not to etch the cantilever contactor 230. In other words, to etch the conductive layer 346 without etching the cantilever contactor 230, as noted above, the conductive material used for the cantilever contactor 230 must be different from the material of the conductive layer 346. Finally, the cantilever contactor 230 is separated from any other materials as shown in the perspective view of FIG. 15L. Although the production process in FIGS. 15A–15L shows only one cantilever contactor 230, in an actual production process, as shown in FIGS. 14A and 14B, a large number of contactors are produced at the same time.

FIGS. 16A–16D are schematic diagrams showing an example of production process for producing the cantilever contactors of the present invention. In this example, an adhesive tape 90 is incorporated in the production process to transfer the cantilever contactors 230 from the silicon substrate 340 to the adhesive tape 90. FIGS. 16A–16D only show the latter part of the production process in which the adhesive tape 90 is involved.

Figure 16A:
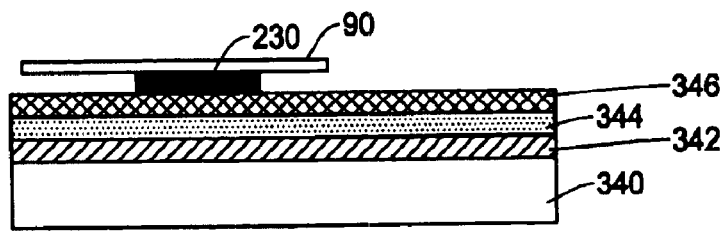
FIGS. 16A–16D are schematic diagrams showing another example of production process for producing the cantilever contactors of the present invention.

FIG. 16A shows a process which is equivalent to the process shown in FIG. 15I where the photoresist layer 348 is removed in the resist stripping process. Then, also in the process of FIG. 16A, an adhesive tape 90 is placed on an upper surface of the cantilever contactor 230 so that the contactor 230 adheres to the adhesive tape 90. As noted above with reference to FIG. 14B, within the context of the present invention, the adhesive tape 90 includes other types of adhesive member, such as an adhesive film and adhesive plate, and the like. The adhesive tape 90 also includes any member which attracts the cantilever contactor 230 such as a magnetic plate or tape, an electrically charged plate or tape, and the like.

Figure 16B:
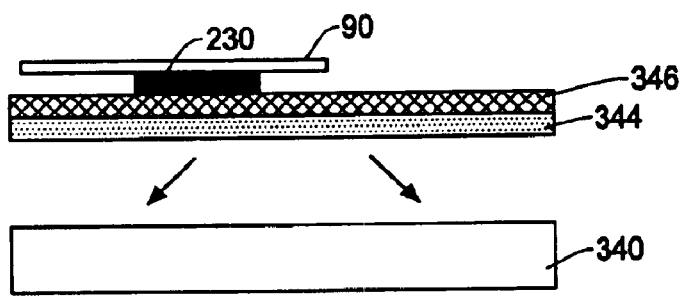
Figure 16C:
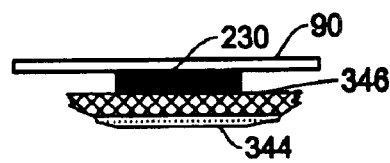
Figure 16D:
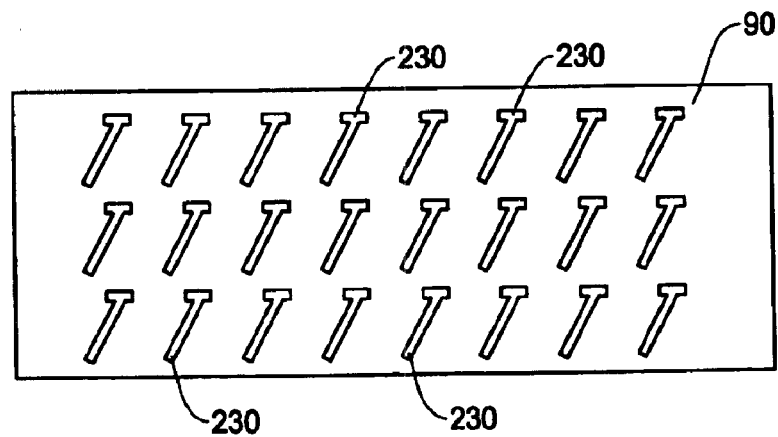

In the process shown in FIG. 16B, the sacrificial layer 342 is etched away so that the cantilever contactor 230 on the adhesive tape 90 is separated from the silicon substrate 340. Another etching process is conducted so that the adhesion promoter layer 344 and the conductive layer 346 are removed from the cantilever contactor 230 as shown in FIG. 16C.

As noted above, in order to etch the conductive layer 346 without etching the cantilever contactor 230, the conductive material used for the cantilever contactor 230 must be different from the material of the conductive layer. Although the production process in FIGS. 16A–16C shows only one cantilever contactor 230, in an actual production process, a large number of contactors are produced at the same time. Thus, a large number of cantilever contactors 230 are transferred to the adhesive tape 90 and separated from the silicon substrate 340 and other materials as shown in the top view of FIG. 16D.

Figure 17A:
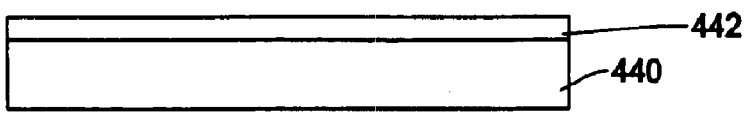
FIGS. 17A–17N are schematic diagrams showing an example of process for producing the cantilever contactors of the present invention on the surface of a substrate and transferring the contactors to an intermediate plate.
Figure 17B:
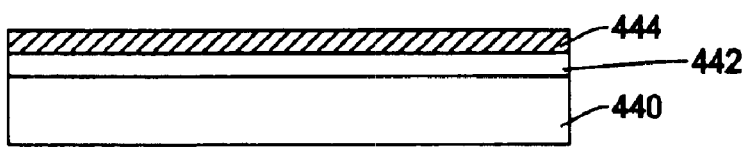
Figure 17C:
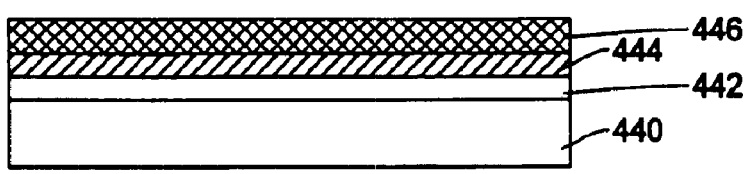
Figure 17D:
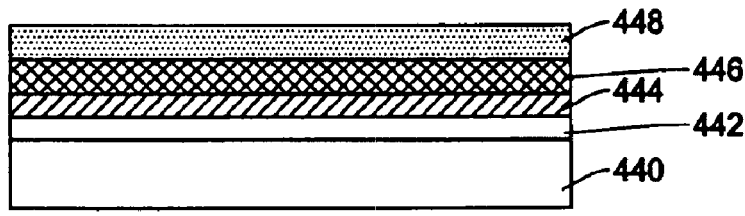
Figure 17E:
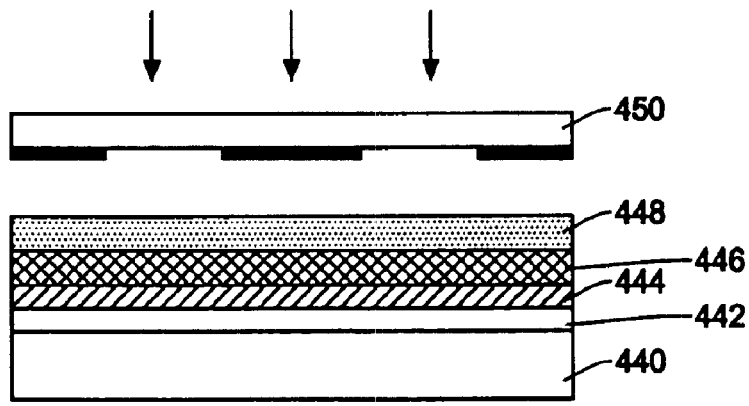
Figure 17F:
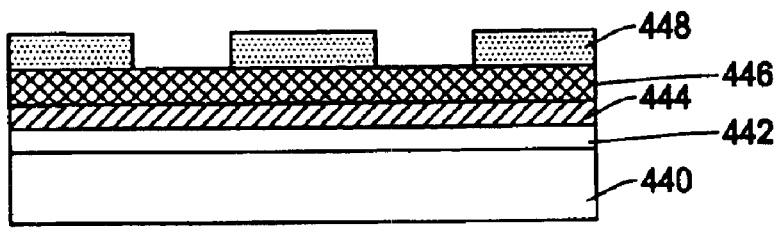
Figure 17G:
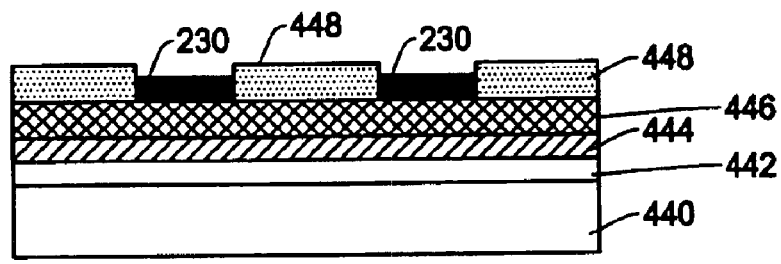
Figure 17H:
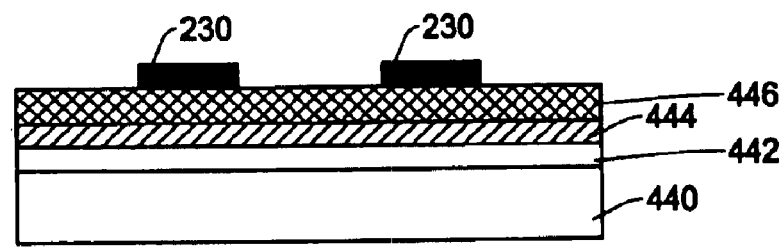
Figure 17I:
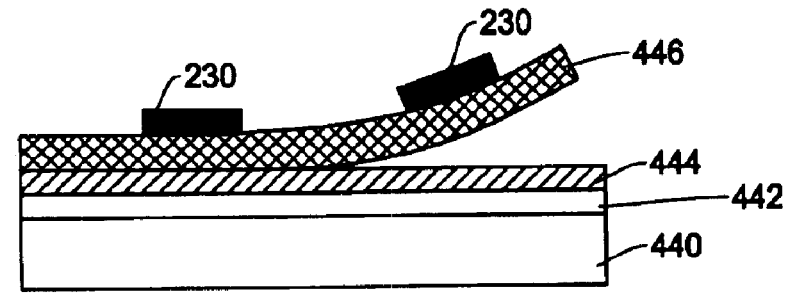
Figure 17J:
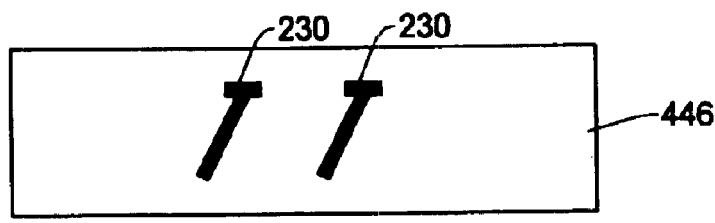
Figure 17K:
Figure 17L:
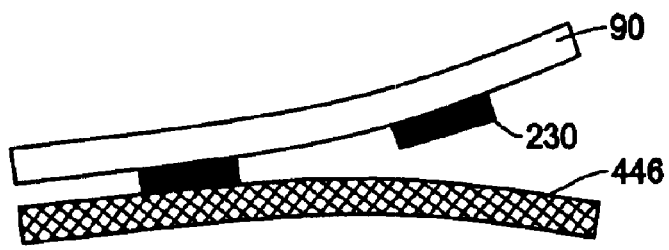
Figure 17M:
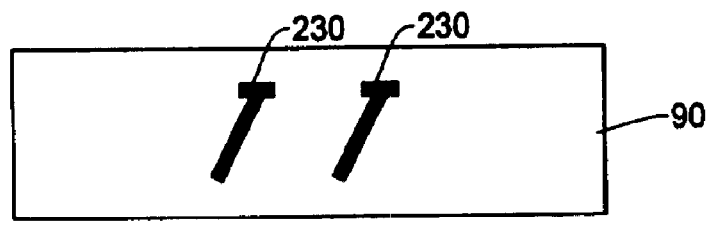
Figure 17N:

FIGS. 17A–17N are schematic diagrams showing a further example of production process for producing the cantilever contactor 230 where the contactors are transferred to the adhesive tape 90. In FIG. 17A, an electroplate seed (conductive) layer 442 is formed on a base substrate 440 which is typically a silicon or glass substrate. The seed layer 442 is made, for example, of copper (Cu) or nickel (Ni), with a thickness of about 1,000–5,000 angstrom, for example. A chrome-inconel layer 444 is formed on the seed layer 442 as shown in FIG. 17B through, for example, a sputtering process.

In the next process shown in FIG. 17C, a conductive substrate 446 is formed on the chrome-inconel layer 444. The conductive substrate 446 is made, for example, of nickel-cobalt (NiCo) with a thickness of about 100–130 micrometer. After passivating the conductive substrate 446, a photoresist layer 448 with a thickness of about 100–120 micrometer is formed on the conductive substrate 446 as shown in FIG. 17D and a photo mask 450 is precisely aligned so that the photoresist layer 448 is exposed with ultraviolet (UV) light as shown in FIG. 17E. The photo mask 450 shows a two dimensional image of the cantilever contactor 230 which will be developed on the surface of the photoresist layer 448.

In the development process, the exposed part of the photoresist can be dissolved and washed away, leaving the photoresist layer 448 of FIG. 17F having a plating pattern transferred from the photo mask 450 having the image (shape) of the cantilever contactor 230. In the step of FIG. 17G, contactor material is electroplated in the plating pattern on the photoresist layer 448 with a thickness of about 50–60 micrometer. An example of the conductive material is nickel-cobalt (NiCo). The nickel-cobalt contactor material will not strongly adhere to the conductive substrate 446 made of nickel-cobalt.

Figure 22B:
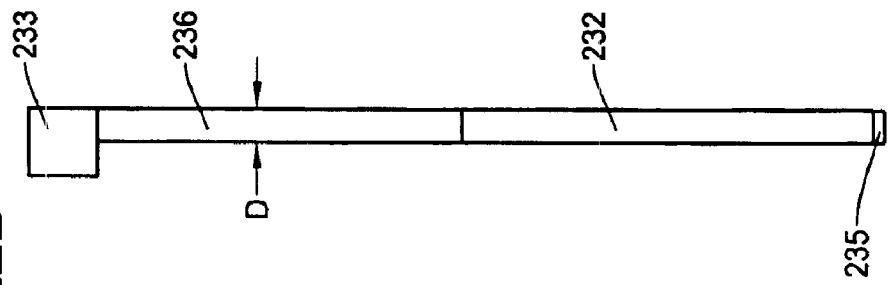
FIGS. 22A–22B are diagrams showing details of the cantilever contactor of the present invention wherein the top end has a small width while having a thickness larger than the other parts of the contactor.
Figure 22A:
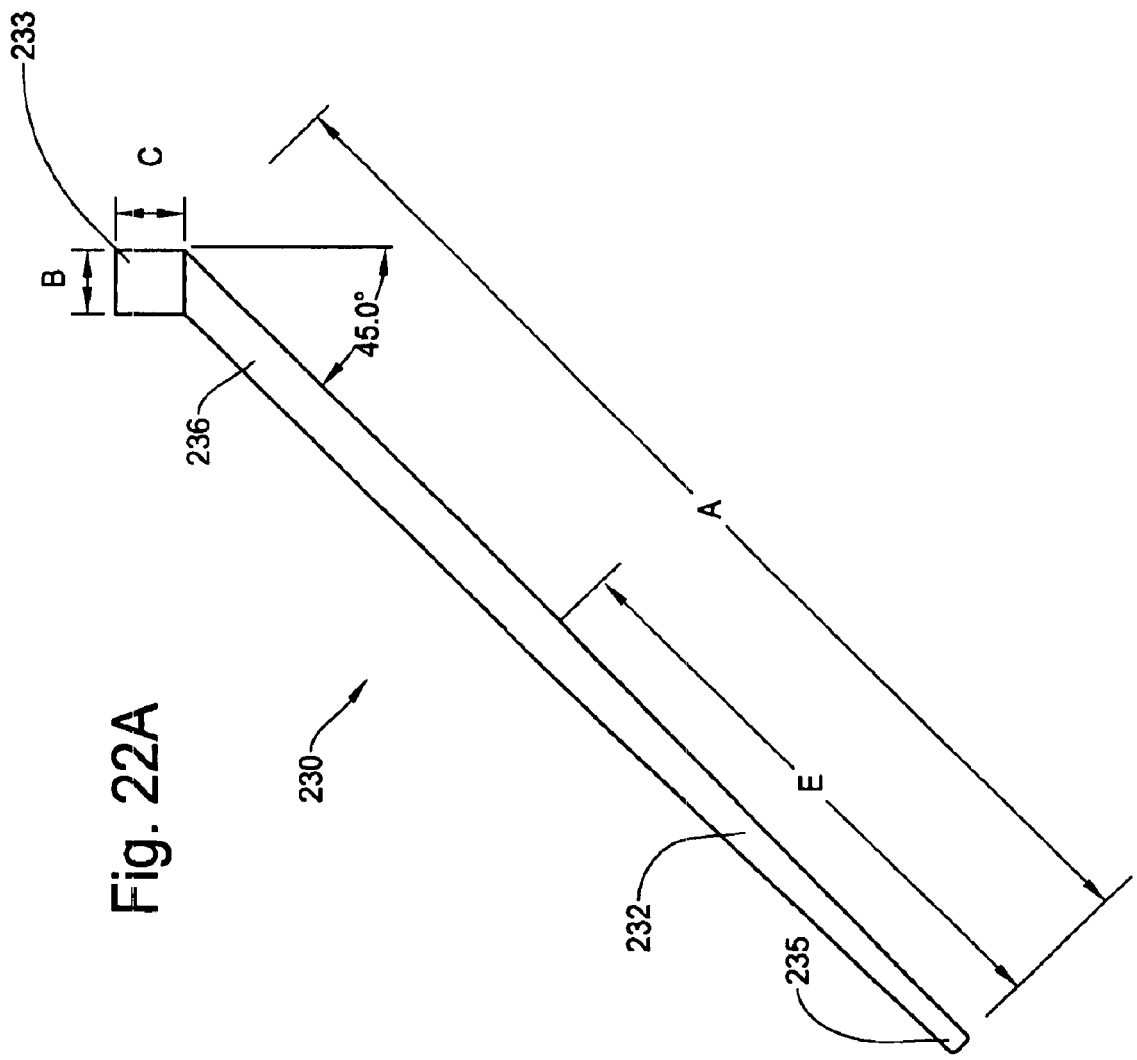

In the case where the cantilever contactor 230 has two or more different thickness, as in the example of FIGS. 22A–22B, the above noted process may be repeated for producing the cantilever contactor 230 by forming two or more conductive layers. Namely, after forming a first layer of the cantilever contactors 230, if necessary, the processes of FIGS. 17D–17G are repeated to form a second layer or further layers on the first layer of the cantilever contactors 230.

In the next process, the photoresist layer 448 is removed in a resist stripping process as shown in FIG. 17H. As shown in FIG. 17I, the conductive substrate 446 is peeled from the chrome-inconel layer 444 on the substrate 440. The conductive substrate 446 is a thin substrate on which the cantilever contactors 230 are mounted with a relatively weak adhesive strength. The top view of the conductive substrate 446 having the cantilever contactors 230 is shown in FIG. 17J.

FIG. 17K shows a process in which an adhesive tape 90 is placed on an upper surface of the cantilever contactors 230. The adhesive strength between the adhesive tape 90 and the cantilever contactors 230 is greater than that between the cantilever contactors 230 and the conductive substrate 446. Thus, when the adhesive tape 90 is removed from the conductive substrate 446, the cantilever contactors 230 are transferred from the conductive substrate 446 to the adhesive tape 90 as shown in FIG. 17L. FIG. 17M shows a top view of the adhesive tape 90 having the cantilever contactors 230 thereon and FIG. 17N is a cross sectional view of the adhesive tape 90 having the cantilever contactors 230 thereon.

Figure 18A:
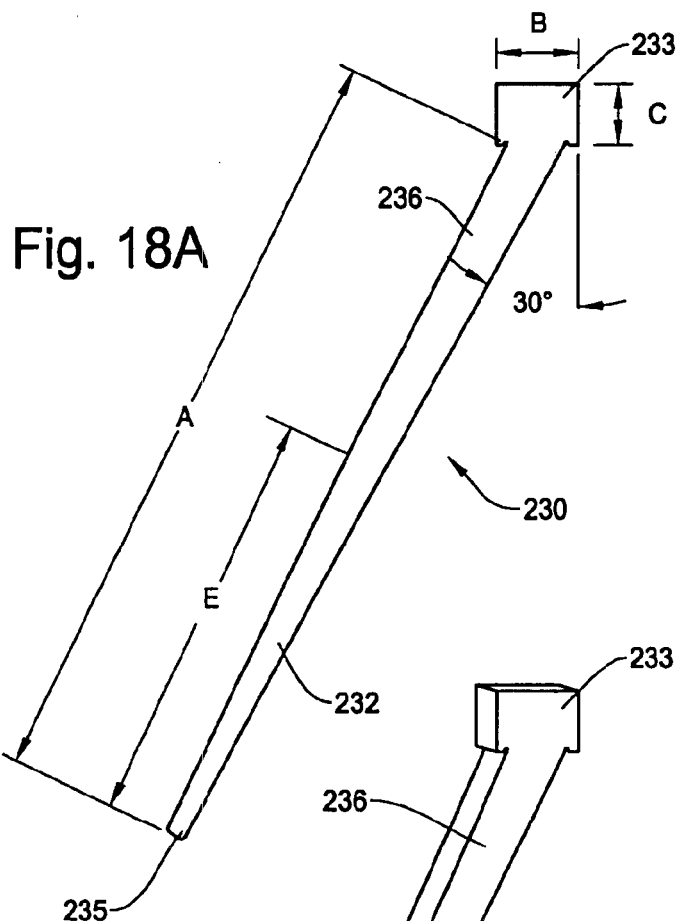
FIGS. 18A–18C are diagrams showing details of the cantilever contactor of the present invention wherein an angle of cantilever is 30°.
Figure 18B:
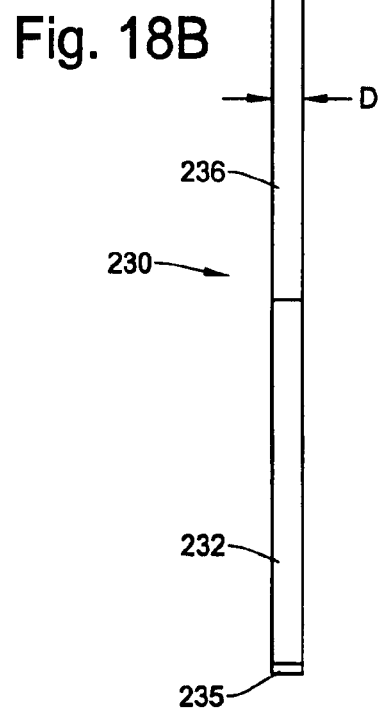
Figure 18C:
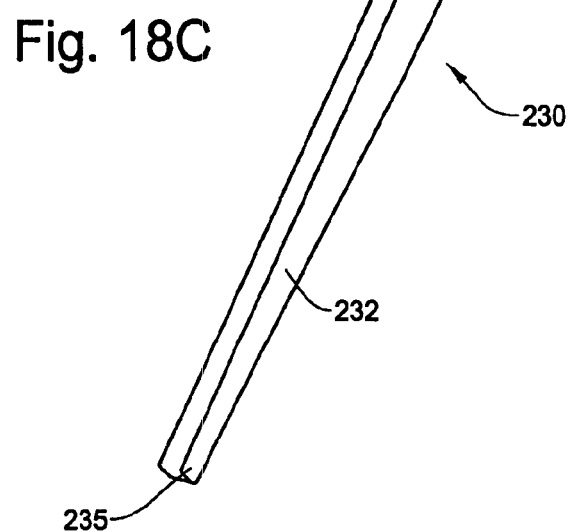

FIGS. 18A–18C are diagrams showing details of the cantilever contactor of the present invention wherein an angle of cantilever is 300. FIG. 18A is a front view of the cantilever contactor, FIG. 18B is a side view of the cantilever contactor, and FIG. 18C is a perspective view of the cantilever contactor. As noted above with reference to FIG. 6, the cantilever contactor 230 has the upper end (base portion) 233, the diagonal beam portion formed of the lower beam (spring) 232 and the upper beam 236, and the lower end (contact portion) 235.

In the example of FIGS. 18A–18C, the diagonal beam has an angle 30° relative to the vertical line as shown in FIG. 18A. As shown in FIG. 18B, the cantilever contactor in this example has the same thickness throughout. The top end 233 of the cantilever contactor 230 has a width larger than that of the upper beam 236. When mounted on the contactor carrier 222 (FIGS. 6–10), the upper beam 236 is secured in the through hole of the contactor carrier 222 and the top end 233 is attached to the upper surface of the contactor carrier 222.

With respect to the size of the cantilever contactor 230 in the example of FIGS. 18A–18C, the length A of the overall diagonal beam portion is 1,470 µm, the width B of the top end 233 is 120 µm, the height C of the top end 233 is 100 µm, the thickness D of the cantilever contactor 230 is 50 µm, the length of the lower beam 232 is 900 µm, the width of the upper beam is 60 µm, and the width of the lower beam is 40 µm.

The inventors of this invention have conducted a finite element analysis (FEA) on the design of the cantilever contactor 230 at the angle of 30° when the cantilever contactor 230 is made of nickel-cobalt. According to the FEA results, the cantilever contactor 230 at the diagonal angle 30° has a spring rate: 2.84 g/mil (mil is $1/1000$ inch), and the maximum over drive value (when safety factor is 1) is 62.3 µm. The inventors evaluate that the cantilever contactor of this example has an excellent spring rate while the over drive value may not be large enough.

FIGS. 19A–19C are diagrams showing details of the cantilever contactor of the present invention wherein an angle of cantilever is 45°. FIG. 19A is a front view of the cantilever contactor, FIG. 19B is a side view of the cantilever contactor, and FIG. 19C is a perspective view of the cantilever contactor. In the example of FIGS. 19A–19C, the diagonal beam has an angle 45° relative to the vertical line as shown in FIG. 19A. As shown in FIG. 19B, the cantilever contactor 230 in this example has the same thickness throughout. The top end 233 of the cantilever contactor 230 has a width larger than that of the upper beam 236. When mounted on the contactor carrier 222 (FIGS. 6–10), the upper beam 236 is secured in the through hole of the contactor carrier 222 and the top end 233 is attached to the upper surface of the contactor carrier.

With respect to the size of the cantilever contactor 230 in the example of FIGS. 19A–19C, the length A of the overall diagonal beam portion is 1,670 µm, the width B of the top end 233 is 140 µm, the height C of the top end 233 is 100 µm, the thickness D of the contactor is 50 µm, the length of the lower beam 232 is 900 µm, the width of the upper beam is 70 µm, and the width of the lower beam is 40 µm.

The inventors of this invention have conducted the finite element analysis (FEA) on the design of the cantilever contactor 230 at the angle of 45° when the contactor is made of nickel-cobalt. According to the FEA results, the cantilever contactor 230 at the diagonal angle 45° has a spring rate: 1.85 g/mil (mil is $1/1000$ inch), and the maximum over drive (when safety factor is 1) is 97.3 µm. It is considered that the cantilever contactor of this example has an excellent spring rate as well as an excellent over drive value.

FIGS. 20A–20B are diagrams showing details of the cantilever contactor of the present invention wherein an angle of cantilever is 60°. FIG. 20A is a front view of the cantilever contactor, and FIG. 20B is a perspective view of the cantilever contactor. In the example of FIGS. 20A–20C, the diagonal beam has an angle 60° relative to the vertical line as shown in FIG. 20A. As shown in FIG. 20B, the cantilever contactor 230 in this example has the same thickness throughout. The top end 233 of the cantilever contactor 230 has a width larger than that of the upper beam 236. When mounted on the contactor carrier 222 (FIGS. 6–10), the upper beam 236 is secured in the through hole of the contactor carrier 222 and the top end 233 is attached to the upper surface of the contactor carrier.

With respect to the size of the cantilever contactor 230 in the example of FIGS. 20A–20C, the length A of the overall diagonal beam portion is 1,270 μm, the width B of the top end 233 is 120 μm, the height C of the top end 233 is 100 μm, the thickness D of the contactor is 50 μm, the length of the lower beam 232 is 600 μm, the width of the upper beam is 40 μm, and the width of the lower beam is 30 μm.

The inventors of this invention have conducted the finite element analysis (FEA) on the design of the cantilever contactor 230 at the angle of 60° when the contactor is made of nickel-cobalt. According to the FEA results, the cantilever contactor 230 at the diagonal angle 60° has a spring rate: 1.1 g/mil (mil is 1/1000 inch), and the maximum over drive (when safety factor is 1) is 65.0 μm. It is considered by the inventors that the cantilever contactor of this example has both an spring rate and an over drive value which are not sufficient compared with the cantilever contactor of 45°.

Figure 21B:
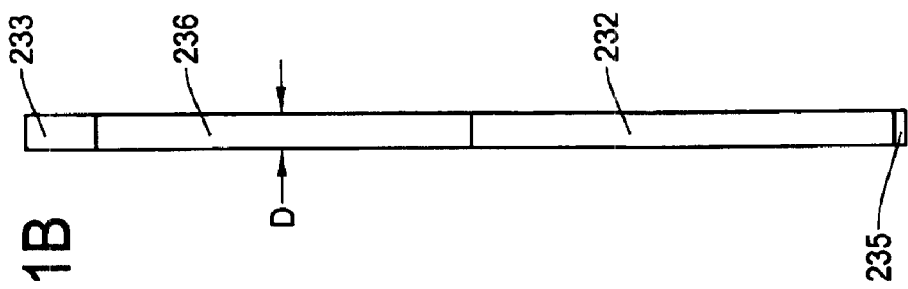
FIGS. 21A–21B are diagrams showing details of the cantilever contactor of the present invention wherein the top end has a width larger than the other parts of the contactor while having the same thickness throughout.
Figure 21A:
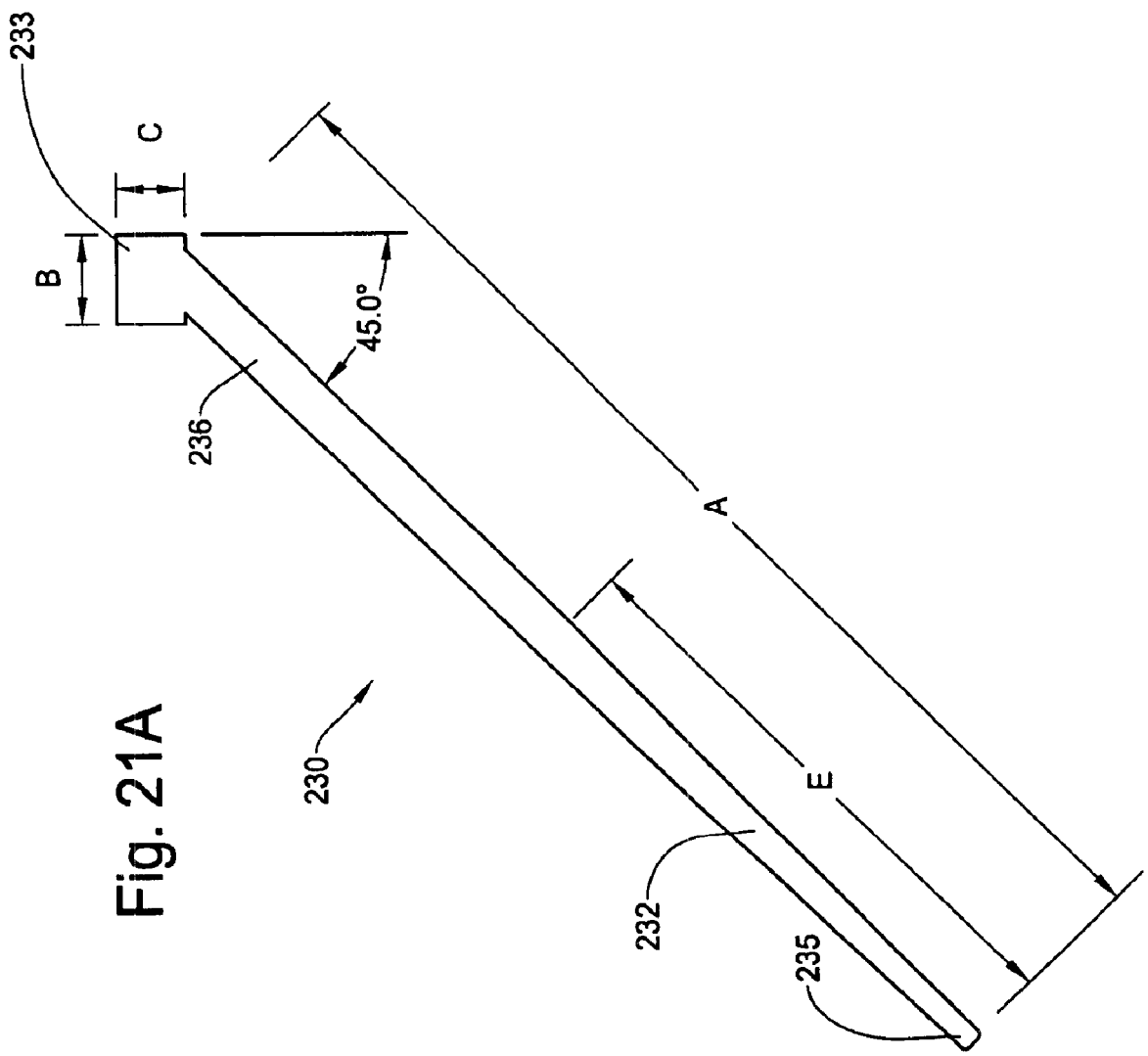

FIGS. 21A–21B are diagrams showing details of the cantilever contactor of the present invention wherein the top end has a width larger than the other parts of the contactor while having the same thickness throughout. FIG. 21A is a front view of the cantilever contactor, and FIG. 21B is a side view of the cantilever contactor. This example of cantilever contactor 230 has an angle of 45° relative to the vertical line as shown in FIG. 21A, thus, it has a structure identical to that shown in FIGS. 19A–19C. When mounted, since the top end 233 has the width wider than the beam portion, the under surface of the top end 233 contacts the upper surface of the contactor carrier 222 and is attached thereto through an adhesive. In the production process, since the thickness of the cantilever contactor 230 is constant throughout, the process of depositing the conductive material is done at the same time with other portions of the contactor by one process.

FIGS. 22A–22B are diagrams showing details of the cantilever contactor of the present invention wherein the top end has the same width as that of the other parts of the contactor but has an increased thickness. FIG. 22A is a front view of the cantilever contactor, and FIG. 22B is a side view of the cantilever contactor. This example of cantilever contactor 230 has an angle of 45° relative to the vertical line as shown in FIG. 22A. As shown in FIG. 22B, the top end 233 has the width which is comparable to the upper beam 236, however, the thickness which is much larger than the other portions of the contactor.

When mounted, since the top end 233 has the larger thickness than the beam portion, the under surface of the top end 233 with the enlarged thickness contacts the upper surface of the contactor carrier 222 and is attached thereto through an adhesive. In the production process, to achieve such a difference in the thickness of the cantilever contactor 230, the process for depositing the conductive material will be repeated for the top end 233 in the above noted production process shown in FIGS. 15–17.

FIG. 23 summarizes the evaluation results of the cantilever contactors of cantilever angle 30°, 45° and 60° of FIGS. 18A–18C, 19A–19C and 20A–20C, respectively. The data table of FIG. 23 lists the properties and capabilities of the cantilever contactor 230 of the present invention with respect to an angle of the cantilever. The inventors of this invention finds that the best performance can be attained by the cantilever contactor 230 with the angle of 45° in the actual application.

FIG. 24 is a cross sectional view showing the contactor carrier 222 in the contact structure of the present invention having diagonal through holes 225 for mounting the cantilever contactors 230 in the angle of 45° relative to the surface thereof. This contactor carrier 222 is designed to mount the cantilever contactors of FIGS. 19A–19C having the cantilever angle 45°. An example of thickness of the contactor carrier 222 is about 500 μm, and the shape of the through hole 225 in top view is rectangular with the size of 100 μm by 50 μm, 70 μm by 50 μm, or 50 μm by 50 μm. The diagonal through holes 225 with 45° are created through, for example, laser micro-machining technology. An example of material of the contactor carrier includes ceramic, silicon nitride, and sapphire.

FIGS. 25A–25D are diagrams showing an example of structure of the contactor carrier 222 in the contact structure of the present invention where FIG. 25A is a top view, FIG. 25B is a cross sectional view, FIG. 25C is an enlarged top view, and FIG. 25D is an enlarged cross sectional view, respectively. In this example, the contactor carrier 222 having a large number of diagonal through holes formed at about the center of the contactor carrier base 220. The array of through holes on the contactor carrier 222 is shown by the dot hatch in FIGS. 25A and 25B.

The enlarged top view of FIG. 25C shows many square or rectangular through holes 225. The through holes 225 are aligned in the matrix manner to mount the cantilever contactors 230 there through. Examples of sizes of the layout of the through holes 225 are, L=50 μm, R=106 μm, S=106 μm, X=212 μm, and Y=212 μm. The enlarged view of FIG. 25D shows many diagonal through holes 225 in cross section. As noted above, an example of thickness of the contactor carrier 222 is about 500 μm. As shown in the top view of FIG. 25C, the diagonal through hole 225 has a square shape in top view with the size of 50 μm by 50 μm, and in the angle 45° relative to the vertical line.

Figure 26A:
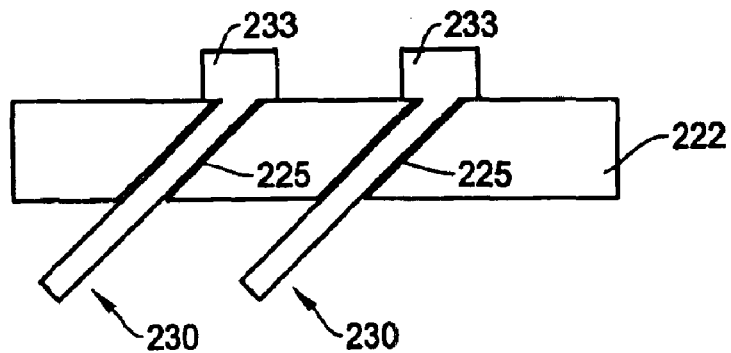
FIGS. 26A–26D are cross sectional diagrams showing an example of process for mounting the cantilever contactors on the contactor carrier and attaching the space transformer to the contact structure through the flip chip bonding.

FIGS. 26A–26D are cross sectional diagrams showing an example of process for mounting the cantilever contactors 230 on the contactor carrier 222 and attaching the space transformer 250 to the contact structure through the flip chip bonding. In FIG. 26A, the cantilever contactors 230 are inserted in the diagonal through holes 225 on the contactor carrier 222. In this example, since the top end 233 of the cantilever contactor 230 has a width larger than the size of the through hole 225, the bottom surface of the top end 233 contacts the top surface of the contactor carrier 222 and stops there.

Figure 26B:
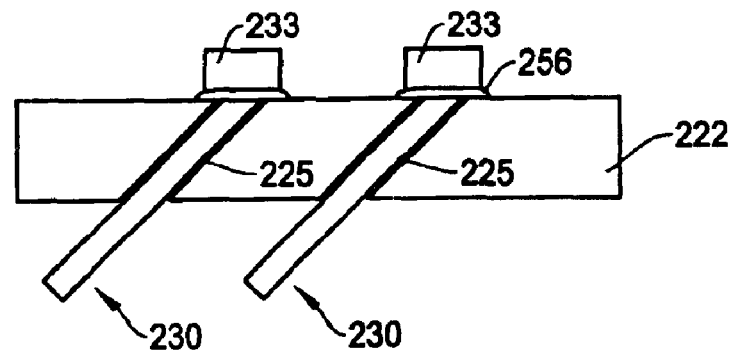
Figure 26C:
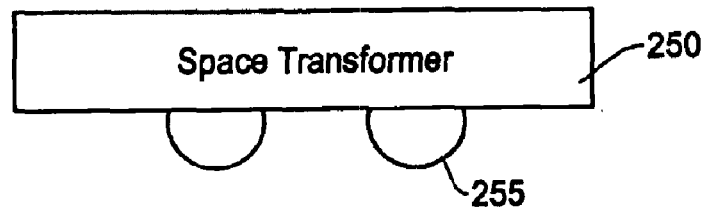
Figure 26D:
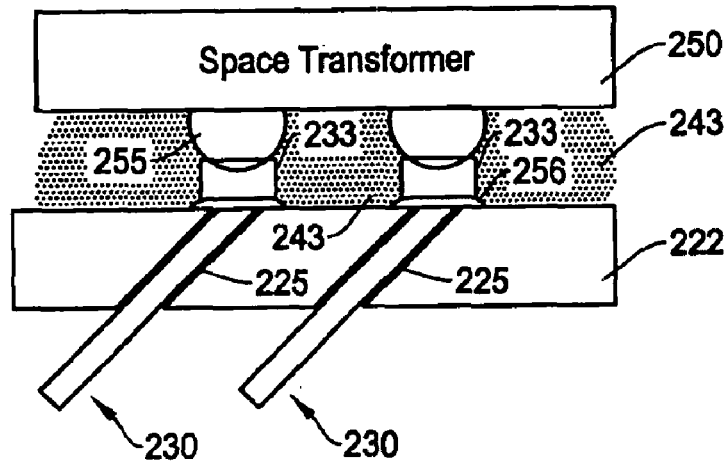

In FIG. 26B, the cantilever contactor 230 is fixed to the contactor carrier 222 by applying an adhesive 256 therebetween. In FIG. 26C, the space transformer 250 is positioned over the contactor carrier 222. The space transformer 250 has the solder bumps 255 for flip chip bonding as described with reference to FIGS. 7A and 7B. As shown in FIG. 26D, the solder bumps 255 and the top ends 233 of the contactors 230 are heated so that the solder reflows to bond the solder bumps 255 and the top ends 233 to one another through the reflow. The adhesive 243 is applied (under fill) between the space transformer 250 and the contactor carrier 222.

FIGS. 27A and 27B are schematic diagrams showing an example of process for picking the cantilever contactors 230 from the adhesive tape 90 and placing the cantilever contactors 230 on the contactor carrier 222. The pick and place mechanism of FIGS. 27A and 27B is advantageously applied to the cantilever contactors produced by the production process of the present invention described with reference to FIGS. 16A–16D and FIGS. 17A–17N involving the adhesive tape. FIG. 27A is a front view of the pick and place mechanism 580 showing the first half process of the pick and place operation. FIG. 27B is a front view of the pick and place mechanism 580 showing the second half process of the pick and place operation.

In this example, the pick and place mechanism 580 is comprised of a transfer mechanism 584 to pick and place the cantilever contactors 230, mobile arms 586 and 587 to allow movements of the transfer mechanism 584 in X, Y and Z directions, tables 581 and 582 whose positions are adjustable in X, Y and Z directions, and a monitor camera 578 having, for example, a CCD image sensor therein. The transfer mechanism 584 includes a suction arm 585 that performs suction (pick operation) and suction release (place operation) operations for the cantilever contactors 230. The suction force is created, for example, by a negative pressure such as vacuum. The suction arm 585 rotates in a predetermined angle such as 90 degrees.

In operation, the adhesive tape 90 having the cantilever contactors 230 are positioned on the respective tables 581 and 582 on the pick and place mechanism 580. As shown in FIG. 27A, the transfer mechanism 580 picks the cantilever contactor 230 from the adhesive tape 90 by suction force of the suction arm 585. After picking the cantilever contactor 230, the suction arm 585 rotates by 90 degrees, for example, as shown in FIG. 27B. Thus, the orientation of the cantilever contactor 230 is changed from the horizontal direction to the vertical direction. This orientation change mechanism is just an example, and a person skilled in the art knows that there are many other ways to change the orientation of the contactors. The transfer mechanism 580 then places the cantilever contactor 230. The cantilever contactor 230 is then inserted in the through holes on the contactor carrier 222.

As has been described above, according to the present invention, the contact structure has very high capabilities in various aspect to meet the test requirements of the next generation semiconductor technology. The cantilever contactors are easily and securely mounted on the contactor carrier in the diagonal through holes. The cantilever contactor has a simple shape with a straight and short diagonal beam, an upper beam of which is secured in the diagonal through hole of the contactor carrier and the lower beam is projected from the contactor carrier and functions as a spring, resulting in a high spring rate, high pitch and pin count, high frequency range, and high over drive capability. Because of the probe contact assembly incorporating the contact structure of the present invention is formed by mounting the contact structure and other components through the flip chip bonding, high reliability, high electrical current capability, and low contact resistance can be achieved.

Since the large number of cantilever contactors are produced at the same time on the substrate without involving manual handling, it is possible to achieve consistent quality, high reliability and long life in the contact performance as well as low cost. Further, according to the present invention, the production process is able to produce a large number of contactors in a horizontal direction on the silicon substrate by using relatively simple technique. The contact structure produced by the present invention are low cost and high efficiency and have high mechanical strength and reliability.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A contact structure for establishing electrical connection with contact targets, comprising:
   a plurality of contactors made of conductive material where each of the contactors is comprised of a top end having a flat top surface, a diagonal beam integral with the top end and configured by an upper beam portion and a lower beam portion, and a lower end at an end of the lower beam portion to contact with a contact target; and
   a contactor carrier having a plurality of diagonal through holes for mounting the plurality of contactors having an angle identical to that of diagonal through holes in a manner that the upper beam portion of the contactor is secured in the diagonal through hole while the lower beam portion of the contactor is projected from a bottom surface of the contactor carrier;
   wherein the top end of each contactor is projected from an upper surface of the contactor carrier; and
   wherein a length of the upper beam portion and a length of the lower beam portion are about the same.

2. A contact structure as defined in claim 1, wherein the top end of each contactor is attached to the contactor carrier through an adhesive.

3. A contact structure as defined in claim 1, wherein the diagonal beam of the contactor has an angle of about 45° relative to a vertical line.

4. A contact structure as defined in claim 1, wherein the contactor is made of conductive material including nickel-cobalt (NiCo) and the contactor carrier is made of ceramic, silicon nitride or sapphire.

5. A contact structure as defined in claim 1, wherein the top end of the contactor has a width larger than that of the through hole of the contactor carrier, thereby contacting the upper surface of the contactor carrier.

6. A contact structure as defined in claim 1, wherein the contactor has the same thickness throughout while the top end of the contactor has a width larger than that of the through hole of the contactor carrier so that the top end contacts with the upper surface of the contactor carrier.

7. A contact structure as defined in claim 1, wherein the top end of the contactor has a thickness larger than that of other portions of the contactor and the through hole of the contactor carrier, thereby contacting the upper surface of the contactor carrier.

8. A method for producing a contact structure, comprising the following steps of:
   (a) forming a sacrificial layer on a surface of a substrate;
   (b) forming a photoresist layer on the sacrificial layer;
   (c) aligning a photo mask over the photoresist layer and exposing the photoresist layer through the photo mask, the photo mask including an image of the contactors;
   (d) developing patterns of the image of the contactors on a surface of the photoresist layer;
   (e) forming the contactors made of conductive material in the patterns on the photoresist layer by depositing the conductive material, each of the contactors having a top end with a flat top surface, a diagonal beam integral with the top end and configured by an upper beam portion and a lower beam portion, and a lower end at an end of the lower beam portion;
   (f) stripping the photoresist layer off;

(g) removing the sacrificial layer from the substrate so that the contactors are separated from the substrate; and (h) mounting the contactors on a contactor carrier by inserting the contactors in diagonal through holes form on the contactor carrier.

9. A method for producing a contact structure as defined in claim 8, after forming the contactors by depositing the conductive material, the method further comprising a step of placing an adhesive tape on the contactors so that the contactors are attached to the adhesive tape.

10. A method for producing a contact structure as defined in claim 8, said step of mounting the contactors on the contactor carrier includes a step of picking the contactor from the adhesive tape and changing orientation of the contactor and attaching the contactor to the contactor carrier with use of a pick and place mechanism which utilizes a suction force to attract the contactor.

11. A method for producing a contact structure, comprising the following steps of:

(a) forming an conductive substrate made of electric conductive material on a base substrate;

(b) forming a photoresist layer on the conductive substrate;

(c) aligning a photo mask over the photoresist layer and exposing the photoresist layer through the photo mask, the photo mask including an image of the contactors;

(d) developing patterns of the image of the contactors on a surface of the photoresist layer;

(e) forming the contactors made of conductive material in the patterns on the photoresist layer by depositing the conductive material, each of the contactors having a top end with a flat top surface, a diagonal beam integral with the top end and configured by an upper beam portion and a lower beam portion, and a lower end at an end of the lower beam portion;

(f) stripping off the photoresist layer;

(g) peeling the conductive substrate having contactors thereon from the base substrate;

(h) placing an adhesive tape on the contactors on the conductive substrate so that the contactors adhere to the adhesive tape wherein adhesive strength between the contactors and the adhesive tape is larger than that between the contactors and the conductive substrate;

(i) peeling the conductive substrate so that the contactors on the adhesive tape are separated from the conductive substrate; and (j) mounting the contactors on a contactor carrier by inserting the contactors in diagonal through holes form on the contactor carrier.

12. A probe contact assembly for establishing electrical connection with contact targets, comprising:

a contactor carrier mounting a plurality of contactors in a manner that diagonal straight beams of the contactors are inserted in diagonal through holes on the contactor carrier and attached to the contactor carrier by an adhesive;

a probe card for establishing electrical communication between electrodes provided on the probe card and a test semiconductor system through mechanical contact pins; and a space transformer provided between the contactor carrier and the probe card for changing a pitch of the contactors to a pitch of the probe card;

wherein each of the contactors is comprised of a top end having a flat top surface, a straight diagonal beam integral with the top end and configured by an upper beam portion and a lower beam portion, and a lower end at an end of the lower beam portion to contact with a contact target.

13. A probe contact assembly as defined in claim 12, further comprising a conductive elastomer which is provided between the space transformer and the probe card to establish electrical connection between the space transformer and the probe card.

14. A probe contact assembly as defined in claim 12, wherein the space transformer has solder bumps which are bonded to the top ends of the contactor through a flip chip bonding method, and a space between the space transformer and the contactor carrier is filled with adhesive to connect with one another.

15. A probe contact assembly as defined in claim 12, wherein the space transformer has solder bumps which are bonded to the top ends of the contactor through a flip chip bonding method, and a space between the space transformer and the contactor carrier is filled with an adhesive to connect with one another, and wherein the probe card has solder bumps which are bonded to corresponding electrodes on the space transformer through a flip chip bonding method, and a space between the space transformer and the probe card is filled with an adhesive to connect with one another.

16. A probe contact assembly as defined in claim 12, wherein the diagonal beam of the contactor has an angle of about 45° relative to a vertical line.

17. A probe contact assembly as defined in claim 12, wherein the contactor is made of conductive material including nickel-cobalt (NiCo) and the contactor carrier is made of ceramic, silicon nitride or sapphire.

18. A probe contact assembly as defined in claim 12, wherein the top end of the contactor has a width larger than that of the through hole of the contactor carrier, thereby contacting the upper surface of the contactor carrier.

19. A probe contact assembly as defined in claim 12, wherein the contactor has the same thickness throughout while the top end of the contactor has a width larger than that of the through hole of the contactor carrier so that the top end contacts with the upper surface of the contactor carrier.

20. A probe contact assembly as defined in claim 12, wherein the top end of the contactor has a thickness larger than that of other portions of the contactor and the through hole of the contactor carrier, thereby contacting the upper surface of the contactor carrier.

* * * * *